(12) United States Patent
Austin

(10) Patent No.: US 11,874,361 B2
(45) Date of Patent: Jan. 16, 2024

(54) SELF-CORRECTING ELECTRICAL CURRENT MEASURING DEVICES

(71) Applicant: Vutility, Inc., Sandy, UT (US)

(72) Inventor: Micheal M. Austin, South Jordan, UT (US)

(73) Assignee: Vutility, Inc., Sandy, UT (US)

( * ) Notice: Subject to any disclaimer, the term of this patent is extended or adjusted under 35 U.S.C. 154(b) by 0 days.

(21) Appl. No.: 17/947,031

(22) Filed: Sep. 16, 2022

(65) Prior Publication Data
US 2023/0093428 A1 Mar. 23, 2023

Related U.S. Application Data

(60) Provisional application No. 63/261,352, filed on Sep. 18, 2021.

(51) Int. Cl.
*G01R 35/00* (2006.01)

(52) U.S. Cl.
CPC ................. *G01R 35/005* (2013.01)

(58) Field of Classification Search
CPC .... G01R 35/005; G01R 22/063; G01R 35/04; G01R 31/67
USPC ........................................................ 324/601
See application file for complete search history.

(56) References Cited

U.S. PATENT DOCUMENTS

2017/0276708 A1   9/2017   Shamir et al.
2019/0037515 A1*  1/2019   Shamir ................. H04J 3/0664

FOREIGN PATENT DOCUMENTS

CN           112782575        5/2021

OTHER PUBLICATIONS

International Search Report dated Dec. 28, 2022 for international application PCT/US2022/043988.

* cited by examiner

*Primary Examiner* — Farhana A Hoque
(74) *Attorney, Agent, or Firm* — Foley & Lardner LLP

(57) ABSTRACT

Systems, devices, methods, and techniques for self-correcting current measuring are disclosed. Advanced material inductive measuring devices can obtain a reading of a monitored current in a monitored source. The advanced material allows the measuring device to operate at low temperatures disproportionate to saturation levels. Readings by the measuring device that are beyond a top-end limit of the measuring system or otherwise outside of a desired band can be transformed or transposed by employing a transformation to correct the reading to be within an acceptable ratio error band.

20 Claims, 17 Drawing Sheets

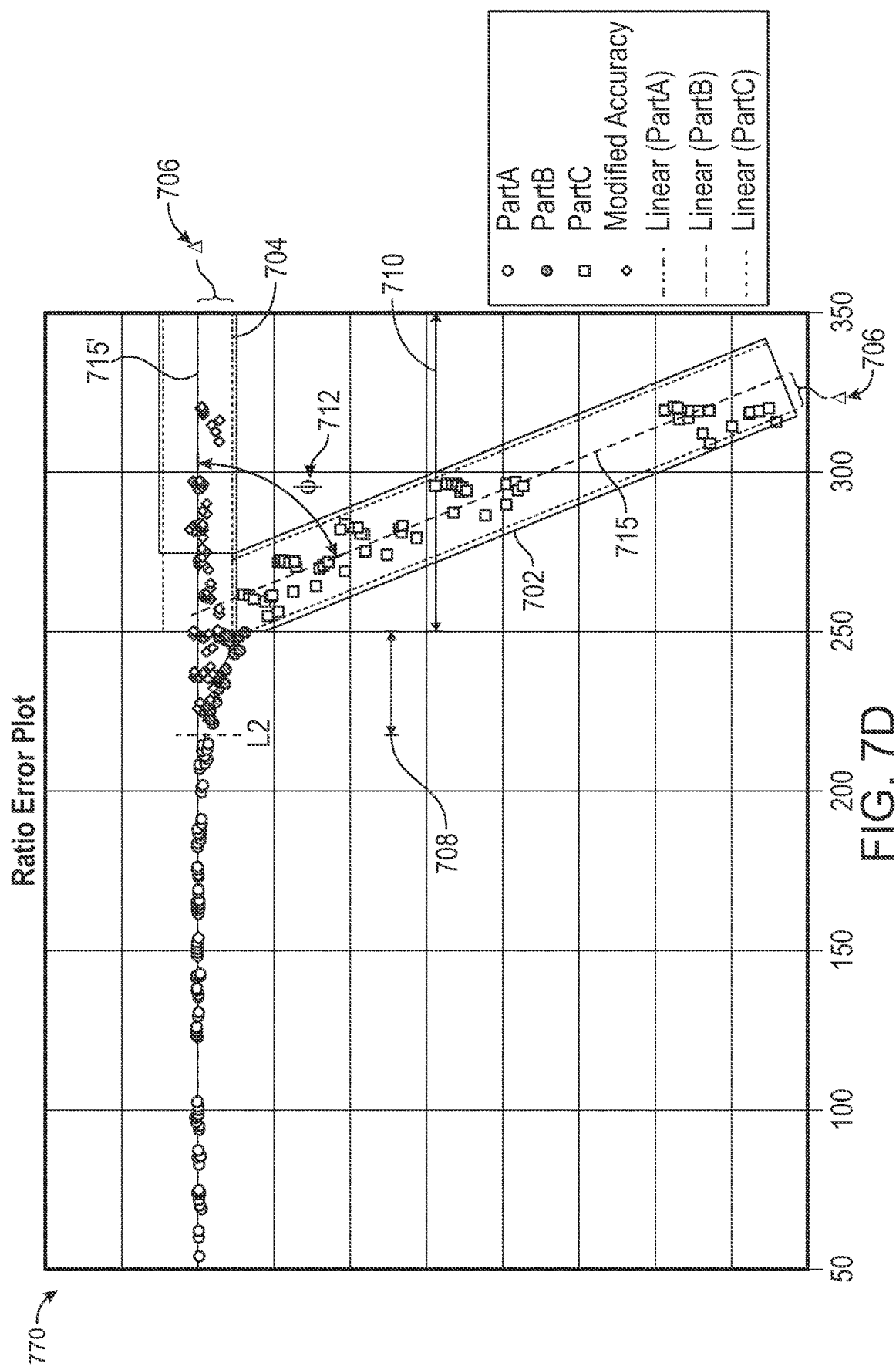

SELF-CORRECTING ELECTRICAL CURRENT MEASURING DEVICES

CROSS-REFERENCE TO RELATED PATENT APPLICATIONS

This application claims priority to U.S. Provisional Application No. 63/261,352, filed Sep. 18, 2021, which is incorporated herein by reference in its entirety.

BACKGROUND

A current measuring device can have various ratings and limits. Beyond the ratings and limits, current measuring devices can be unsafe or unstable at operating or measuring currents.

SUMMARY

Systems, devices, methods, and techniques for self-correcting current measuring are disclosed. An inductive measuring device can obtain a reading of a monitored current in a monitored source. The measuring device can be a current transformer comprised of an advanced material that operates at low temperatures disproportionate to saturation levels. Readings by the measuring device that are beyond a top-end limit of the measuring system or otherwise outside a desired band can be transformed, or transposed by a transformation to correct the reading to be within an acceptable ratio error band.

BRIEF DESCRIPTION OF THE DRAWINGS

FIG. 7D is another example transformation plot in connection with the error plots of FIGS. 5-6, according to some implementations.

Figure 1A:
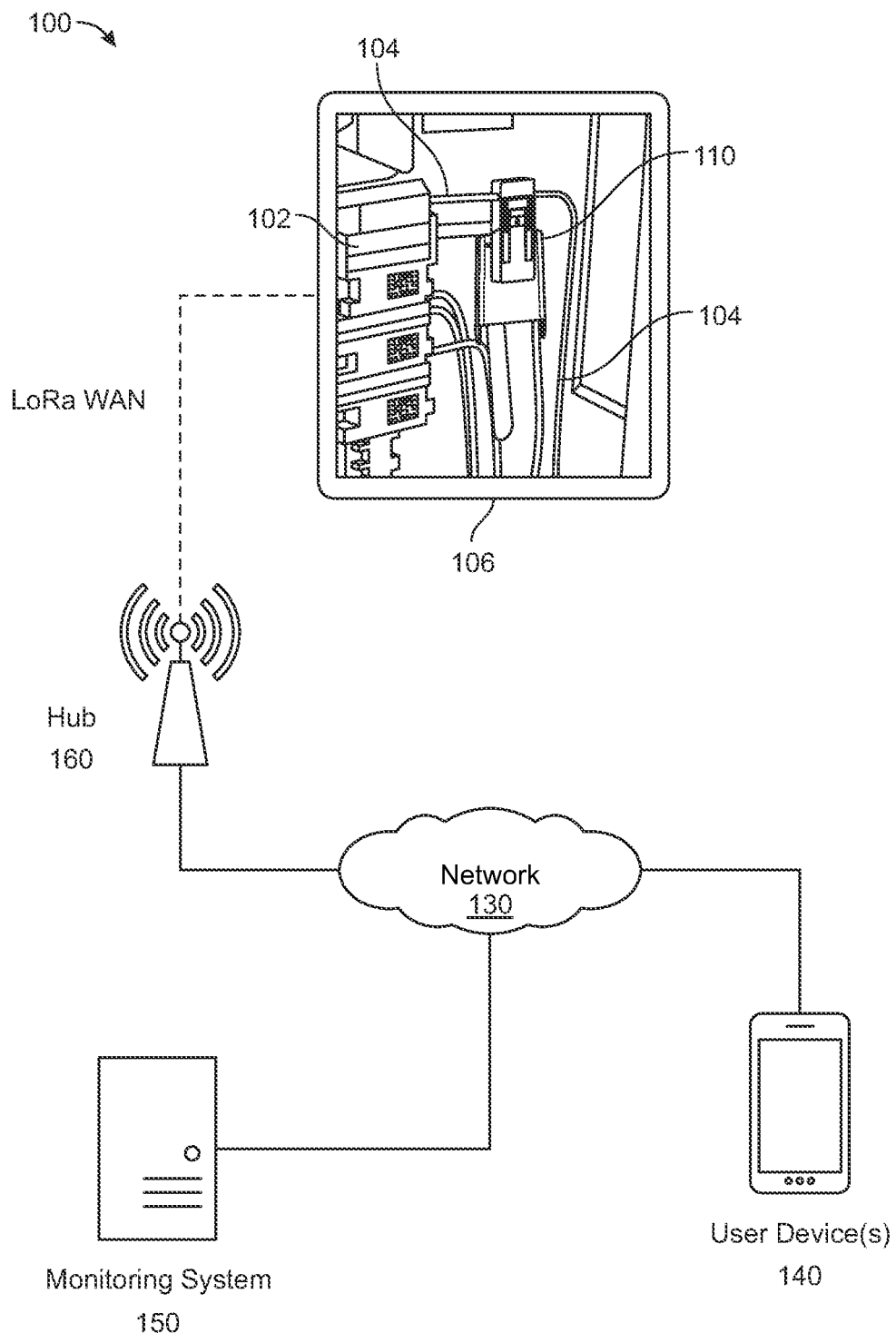
FIG. 1A is a block diagram depicting an implementation of an electricity usage metering (EUM) system and associated environment, according to some implementations.

It will be recognized that some or all of the figures are schematic representations for purposes of illustration. The figures are provided for the purpose of illustrating one or more embodiments with the explicit understanding that they will not be used to limit the scope or the meaning of the claims.

DETAILED DESCRIPTION

The present disclosure pertains to systems and methods that relate generally to measuring current through a monitored source and modifying measurements to extend the boundaries of operation (e.g., top-end limit) of the systems and methods described herein. In particular, when a measurement exceeds physical limits arising from a natural property of a material, the systems and methods described herein can adjust and/or correct the measurement to maintain the accuracy of the measurement while achieving safe operating temperatures and increasing the top-end measurement limits. That is, a typical current measuring device based on a current transformer (CT) has a top-end limit or rating for providing accurate readings within an acceptable ratio error. Beyond the top-end limit, saturation in secondary windings of the CT cause the readings of the primary current (iP) in the primary conductor, which are based on the secondary current (iS) in the secondary windings multiplied by the number of windings, to be outside the acceptable ratio error.

In many scenarios, a typical 100 Amperes (Amps) AC current measuring device is rated at 100 Amps based on a CT top-end limit on iP, for example at 120% or 120 Amps. Therefore, the rating is stated as 100 Amps, but the current measuring device is safe up to 120 Amps while meeting all temperature restrictions. This limit or rating is based on temperature testing results from a testing body, such as Underwriter's Laboratory (UL), and is given to any prospective current measuring device to inform users of the "safe-temperature-region-rated Amps" that can still provide accurate readings (i.e., accurate within an acceptable error). Beyond the top-end limits specified, coil saturation and escalating resistance in secondary windings (e.g., a tiny wire) of the current measuring device can cause internal coil heating, which induces even higher resistance because the wire (metal) attributes at elevated temperatures change, usually due to higher resistance and thus, the readings are no longer accurate. More specifically, the relationship of the measured-line-current, otherwise called the primary conductor or primary current (iP), is based on the ratio of the secondary current induced by magnetic flux in the secondary windings multiplied by the number of windings. This ratio of true primary current and measured secondary current is compared to the theoretical value and the difference between the two (measured and theoretical) is called the "ratio error" percentage. This ratio error should be inside an acceptable ratio error percentage to represent the measured current accurately (e.g., +/−4.0% is a common industry acceptable (e.g., standard) error deviation in a CT).

Extending the upper bound of accurate measuring of an electrical current measuring device can involve both improved mechanical functionality by reducing sizing and improved circuit efficiency (e.g., current harvesting) and accuracy over an industry working range while eliminating the use of multiple current measuring devices to provide current measurements. Accordingly, the systems and methods described herein extend the boundaries of operation of electrical current measuring devices while achieving normal ambient temperatures and not increasing risk or otherwise decreasing safety (e.g., continuing to meet UL requirements).

In some systems, new materials have been developed for use in current measuring applications, and specifically in the core of a CT out of a desire to place smaller devices in smaller places (e.g., electrical distribution panel cover plates). These developments led to an advanced nano-layered material technology (e.g., nano-layered silicon-carbide material) that is 60% smaller than the ferrite solutions (shown with reference to FIG. 4), and advanced the thermal management and magnetic flux density of a CT. This nano-layered material can be used in the primary core of CT devices. The advanced nano-layered materials operate with higher-flux densities and at lower temperatures (e.g., the operating temperature does not increase as fast or drastically at higher currents and can delay the saturation of the secondary windings as primary currents increase). Accordingly, a current measurement device having a CT core including advanced nano-layered materials can safely be operated above the top-end limits of typical current maximums. Stated otherwise, these advanced nano-layered material are able to extend the boundaries of operation of a CT device (e.g., measuring current) while achieving safe deltas to ambient temperatures and not increasing risks or otherwise decreasing safety (e.g., still meeting all UL requirements). However, although safe operating temperatures are achievable over an extended range of current measuring, the accuracy of the readings of present current measurement devices incorporating the use of other advanced materials remains unpredictable and inaccurate in the extended ranges (e.g., above 240 Amps for a CT rated at 200 Amps). Thus, the present disclosure provides advantages over typical AC current measuring devices by extending an upper bound of current readings while maintaining accuracy of the measurements. The present disclosure provides improvements, employing a transformation model as a function of the secondary current measured and the inverse relationship of the primary current ratio (and ratio error at that position on the line) to extend the upper bound of accurate readings for devices having advanced nano-layered materials. Extending the upper bound of accurate measurement can eliminate a need for multiple current measuring devices to provide current measurements over an industry working range.

Accordingly, the present disclosure is directed to systems and methods that utilize a transformation model to extend the upper bound of accurate measurement by a CT current measuring device. In some implementations, the transformation model can include a ratio error linear "curve-fit" pattern that yields a rotational angle constant. The rotational angle constant can be utilized in and/or to derive a transformation function or transposition. In some implementations, the transformation model can include performing an adjustment error-correction that transforms the secondary current reading using a transformation function and transforms the error-ratio position into an accurate primary current reading. Furthermore, the ratio error above the top-end limit (e.g., 120 Amps of a CT rated for 100 Amps) can be transposed into the same reference axis as the ratio error plot below the top-end limits.

FIG. 1A is a block diagram depicting an implementation of an electricity usage metering (EUM) system 110 and associated environment 100, according to some implementations. The one or more user device(s) 140 (e.g., smartphones, tablets, computers, etc.) may be used by a user to perform various actions and/or access various types of content, some of which may be provided over a network 130 (e.g., the Internet, LAN, WAN, LoRa WAN, etc.). A "user" or "entity" as used herein may refer to an individual operating user devices 140, interacting with resources or content via the user devices 140, etc. The user devices 140 may be used to send data to and receive data from the EUM system 110 and the monitoring system 150 or may be used to access websites (e.g., using an internet browser), access mobile applications, access videos (e.g., television, livestreams) and other media files, communicate with smart assistants, and/or access/interact with any other types of content.

The monitoring system 150 can include one or more processors (e.g., any general purpose or special purpose processor), and can include and/or be operably coupled to one or more transitory and/or non-transitory storage mediums and/or memory devices (e.g., any computer-readable storage media, such as a magnetic storage, optical storage, flash storage, RAM, etc.). The monitoring system 150 may compile received data to provide current monitoring for both the on-state and off-state of the EUM system 110. The monitoring system 150 can receive data from the EUM system 110 (e.g., via the network 130 and/or from the hub 160). This data can include the measured current and the predetermined threshold value. The monitoring system 150 can receive data from one or more EUM systems 110.

The monitoring system 150 may determine an off-state time period and a past electrical current that was in the monitored energy source (e.g., a wire 104 from the electricity supply 102) while the EUM system 110 was storing electrical energy. For instance, to determine a length of the off-state time period, the monitoring system 150 may compare the time stamps between received current measurements. To determine the past electrical current the monitoring system 150 may use a predetermined threshold level.

In some implementations, the monitoring system 150 may receive a first set of current monitoring parameters from a EUM system 110 for a first time period, the current monitoring parameters including measured current in a monitored energy source during a first time period. The monitoring system 150 may further receive a second set of current monitoring parameters from the EUM system 110 for a second time period, the current monitoring parameters including measured current in the monitored energy source during the second time period. The first time period and the second time period may be different, and there may be a third time period between the first time period and the second time period. To determine the past current that passed through the monitored energy source during the third time period, the monitoring system 150 may consider an amount of current needed to power the EUM system 110 and the length of time between the first time period and the second time period.

In general, the EUM system 110 may include any variety of consumptive circuits and systems (e.g., consumptive of energy) (described in detail with reference to FIG. 1B) that perform operations to accomplish a variety of functions in addition to or other than detection and/or measurement of current in the wire 104 from the monitored electricity supply 102 of the distribution board 106. For example, the EUM system 110 may detect or measure a voltage across an electrical conductor or portion thereof. The EUM system 110 may provide a transmission of data. The EUM system 110, in some implementations, may gather voltage and/or current data for more than one monitored energy source (e.g., the distribution board 106) at a time. In another implementation, the EUM system 110 can infer from the elapsed time during an off-state (i.e., powered off) how much current was consumed and for how long. This may be accomplished by knowing the amount of current (through the wire 104) to charge the EUM system 110 and obtaining timestamps of the last read and the immediate activation timestamp. As a result, the EUM system 110 can draw an inference as to how much time elapsed to consume the requisite base current load on the wire 104 (or monitored energy source) between reads. In other words, the EUM system 110 may evaluate energy while in an off-state by considering that the system requires "x" energy to power up again, therefore enabling deduction (e.g., given timestamps of last measure and next measure) that a known energy amount occurred while the EUM system 110 was charging. The EUM system 110 may provide both real-time reading (while the EUM system 110, and specifically the processing circuit, is powered), and accumulated data (while the EUM system 110 is charging).

The EUM system 110 can include one or more processors (e.g., any general purpose or special purpose processor), and can include and/or be operably coupled to one or more transitory and/or non-transitory storage mediums and/or memory devices (e.g., any computer-readable storage media, such as a magnetic storage, optical storage, flash storage, RAM, etc.). In various implementations, the EUM system 110 and the hub 160 can be implemented as separate systems or integrated within a single system (e.g., the hub 160 can be configured to incorporate some or all of the functions/capabilities of the EUM system 110). The EUM system 110 may be configured to communicate over the network 130 via a variety of architectures (e.g., client/server, peer-to-peer, etc.). The EUM system 110 can be configured to provide a variety of interfaces for analyzing measurements collected and interpreted (e.g., modeled) by the EUM system 110.

The EUM system 110 may transmit and provide information to the hub 160 and/or a network 130. In some implementations, the transmission may be by wireless protocol via a wireless technology. The transmission may include data indicating a measurement taken of the current in the wire 104. In this manner, current in the wire 104 can be monitored and/or measured remotely (e.g., from a remote operation center). Further, the measurements of the current can be processed remotely from the wire 104. In some implementations, data concerning the current in the wire 104 provided by the electricity supply 102 can be presented to a remote user, such as via an application on the user device 140. In some implementations, the data may be presented via other user interfaces, including but not limited to a web interface, a compiled program, a downloadable spreadsheets, APIs, on-board screens, sounds, alerts, notifications, and the like.

The EUM system 110 can be inductively powered (e.g., by an inductive loop around the wire 104) and can monitor electricity current in an electrical conductor (i.e., the wire 104 coming from the electricity supply 102). For example, the wire 104 may be in a three-phase power line to a building. In another example, the wire 104 may be in a line from a distribution board 106 (or conductive panel). The EUM system 110 may be a CT. The CT may, in one implementation, be a CT clamp having a split core to allow the CT to be clipped around or otherwise clamped or interfaced to the wire 104. The CT can conduct a fluctuating magnetic field from a fluctuating flow of electrical current in the wire 104 (i.e., monitored energy source).

In some implementations, the EUM system 110 may be an inductive frequency panel (e.g., compatible with Qi, an open interface standard developed by the Wireless Power Consortium for inductive charging over distances). The EUM system 110 can produce a fluctuating magnetic field from a fluctuating flow of electrical current in the wire 104. In some implementations, the fluctuating flow of electrical current in the wire 104 may be alternating current (AC). In other implementations, the fluctuating flow of electrical current in the wire 104 is direct current (DC). The fluctuating magnetic field can induce an electromotive force within a second electrical conductor of the EUM system 110 to produce electrical energy. For example, the second electrical conductor may be a coil or a wire. Additional details relating to the features and functions of the EUM system 110 are provided herein with respect to FIG. 1B.

Figure 1B:
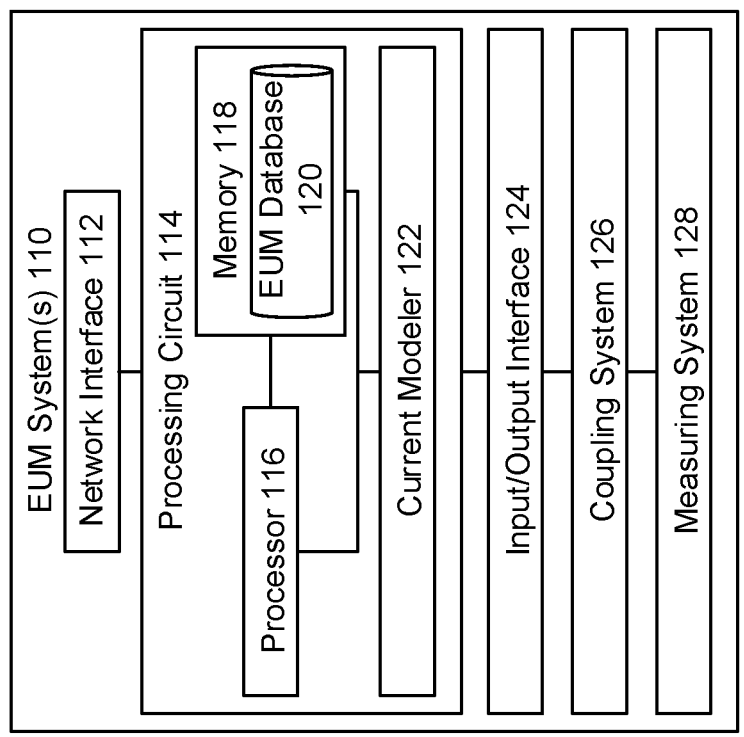
FIG. 1B is a block diagram depicting an implementation of a EUM system, according to some implementations.

FIG. 1B is a block diagram depicting an implementation of an electricity usage metering (EUM) system 110 (shown as "EUM system 110" in FIG. 1B), according to an illustrative implementation. The EUM system 110 may be similar and/or identical to the EUM system 110 of FIG. 1A. The EUM system 110 can be run or otherwise executed on one or more processors of a computing device, such as those described below in the discussion of FIG. 9. The EUM system 110 can include a network interface 112, a processing circuit 114, a processor 116, a memory 118, a EUM database 120, a current modeler 122, an input/output (I/O) interface 124, a coupling system 126, and a measuring system 128. It should be understood that various implementations may include more, fewer, or different systems than illustrated in FIG. 1B, and all such modifications are contemplated within the scope of the present disclosure.

The network interface 112 is structured and used to establish connections with other computing systems and devices (e.g., the monitoring system 150, the user device 140, etc.) via the network 130 and/or hub 160. The network interface 112 includes program logic that facilitates connection of the EUM system 110 to the network 130 (e.g., via the hub 160). For example, the network interface 112 may include any combination of a wireless network transceiver (e.g., a cellular modem, a Bluetooth transceiver, a Wi-Fi transceiver, a long range (LoRa) WAN, etc.) and/or a wired network transceiver (e.g., an Ethernet transceiver). In some implementations, the network interface 112 includes the hardware (e.g., processor, memory, and so on) and machine-readable media sufficient to support communication over multiple channels of data communication. Further, in some implementations, the network interface 112 includes cryptography capabilities to establish a secure or relatively secure communication session in which data communicated over the session is encrypted. For example, the network interface 112 may securely encrypt data that is transmitted (e.g., to the network 130 via the hub 160).

The processing circuit 114 includes a processor 116, a memory 118, a EUM database 120, and a current modeler 122. The memory 118 may be one or more devices (such as EUM database 120, e.g., static RAM, dynamic RAM, flash memory, one or more flip-flops, or other electronic storage medium, hard disk storage) for storing data and/or computer code for completing and/or facilitating the various processes described herein. The memory 118 may be or include non-transient volatile memory, non-volatile memory, and non-transitory computer storage media. The memory 118 may include database components, object code components, script components, or any other type of information structured for supporting the various processes and information structures described herein. The memory 118 may be communicably coupled to the processor 116 and include computer code or instructions for executing one or more processes described herein.

The processor 116 may be implemented as one or more application specific integrated circuits (ASICs), field programmable gate arrays (FPGAs), a group of processing components, or other suitable electronic processing components. The processor 116 may include any computing circuitry to perform operations to detect, measure, and/or infer a voltage or current within an energy source. The processor 116 may include general purpose processors and/or special purpose processors. In one embodiment, the processor 116 include a LoRa® chip and/or a Bluetooth® chip to provide special purpose transmit (Tx) and/or receive (Rx) functionality for communicating with other computing devices. These special purpose Tx/Rx chips may supplement and/or be included in the network interface 112.

The memory 118 may store a EUM database 120, according to some embodiments. The data stored in the EUM database 120 may include data generated by the processing circuit 114, such as by the current modeler 122. For example, the EUM database 120 may be configured to store, but is not limited to, current measurements (e.g., primary, secondary, historical current measurements), measurement system 128 parameters (e.g., winding loops) and limitations (e.g., ratings such as for safe operation, accuracy such as top-end and bottom-end, saturation, etc.), voltage measurements, models (e.g., transformation model), measurement plots, energy source information, etc. For example, the current modeler 122 can execute a transformation model that is stored in the EUM database 120.

The current modeler 122 can receive measurements from the measurement system 128 and generate current estimates based on modeling the received measurements. The measurements may include a secondary current measurement collected by the measurement system 128 and based on a primary current (sometime referred to herein as a "monitored current") of a monitored energy source (e.g., the electricity supply 102) via a wire (e.g., the wire 104 of FIG. 1). In some implementations, the current modeler 122 can be configured generate an estimated (or derived) primary current based on modeling the secondary current measurement. In general, the current modeler 122 can perform operations to infer a current through a monitored energy source, based on readings from other components, such as the measuring system 128. The current modeler 122 can determine one or more estimated primary currents are beyond the top-end limit of the EUM system 110. Additionally, the modeler 112, can also be configured to perform transformation of the estimated primary current to a corrected reading based on executing a transformation model to correct the reading to be within an acceptable ratio error. The modeler 112 executing the transformation model may transpose (recast or otherwise change) the data set to clearly enable or otherwise allow an inference of (e.g., formulaically or mathematically "backing into") the primary current.

The input/output interface 124 can be configured to receive communications from and provide communications to the user device(s) 140 and the monitoring system 150. In general, the I/O interface 124 may facilitate interfacing with one or more input devices and/or one or more output devices. For example, the input/output interface 124 is structured to exchange data, communications, instructions, etc., with an input/output component of the monitoring system 150 and the user device 140. In one embodiment, the input/output interface 124 includes communication circuitry for facilitating the exchange of data, values, messages, and the like between the input/output interface 124 and the components of the monitoring system 150 and the user device 140. In yet another embodiment, the input/output interface 124 includes machine-readable media for facilitating the exchange of information between the input/output interface 124 and the components of the monitoring system 150 and the user device 140. In yet another embodiment, the input/output interface 124 includes any combination of hardware components, communication circuitry, and machine-readable media. In some embodiments, the input/output interface 124 includes suitable input/output ports and/or uses an interconnect bus (not shown) for interconnection with a local display (e.g., a touchscreen display) and/or keyboard/mouse devices (when applicable), or the like, serving as a local user interface for programming and/or data entry, retrieval, or other user interaction purposes. As such, the input/output interface 124 may provide an interface for the user to interact with various systems and circuits of the EUM system 110.

The coupling system 126 can couple the EUM system 110 to a monitored energy source via a wire for monitoring the electrical current of the monitored energy source. In some implementations, the coupling system 126 can be a coupling component that electrically couples to the monitored energy source. For example, the coupling component can be, but is not limited to, a fastener (e.g., hook-and-loop, bolt, screw), living hinge, latch, buckle, fitting, adapter, a combination of one or more coupling components, etc. Moreover, the phrases "connected to" and "coupled to" are used herein in their ordinary sense and are broad enough to refer to any suitable coupling or other form of interaction between two or more components. Two components may be coupled to each other even though they are not in direct contact with each other. The phrase "attached to" refers to interaction between two or more components that are in direct contact with each other.

In some implementations, the coupling system 126 can be electrically coupled to produce an electrical current using an upper housing part and lower housing part. The upper housing part and the lower housing part can be configured to align and couple magnetic core halves together when the housing is disposed in a closed configuration. The features of the coupling system 126 are described in greater detail below, with reference to FIGS. 2A-2C and 3A-3B. Additionally, an example of a coupling system 126 of EUM system 110 is described in U.S. patent application Ser. No. 17/204,539, filed Mar. 17, 2021, the entire disclosure of which is incorporated by reference herein.

The measuring system 128 can produce (or conduct) an electrical current due to a fluctuating magnetic field induced from a fluctuating flow of electrical current in a monitored energy source. In general, the measuring system 128 can produce a fluctuating magnetic field from a fluctuating flow of electrical current in a wire. In some embodiments, the fluctuating flow of electrical current in the wire may be alternating current (AC). In other embodiments, the fluctuating flow of electrical current in the wire may be direct current (DC). The fluctuating magnetic field can induce an electromotive force within the measuring system 128 (e.g., in particular an electrical conductor) to produce electrical energy. The electrical conductor may be a coil or a wire that is electrically coupled to or included in the measuring system 128. In some implementations, the EUM system 110 can be self-powered such that the electrical current induced by the measuring system 128 may provide systems and circuits of the EUM system 110 with power. In particular, the measuring system 128 can include electrical components such as, but not limited to, an advanced nano-layered material. As used herein, "advanced nano-layered material" can be a material that is thermally stable with a magnetic density and a saturation area (sometime referred to as a "saturation region," "top-end limit," or "top-end rating"), etc. In some implementations, the advanced nano-layered material can be silicon carbide (SiC). In various implementations, the advanced nano-layered material can be an electromagnetic interface (EMI) shielding material.

In some embodiments, the measuring system 128 can include a split-core CT. In particular, having a split-core to allow the split-core CT to be clipped around or otherwise clamped or interfaced to the monitored energy source. In other embodiments, the measuring system 128 can include an inductive frequency panel (e.g., compatible with Qi). The features of the measuring system 128 are described in greater detail below, with reference to FIGS. 2A-2C and 3A-3B. Additionally, an example of a measuring system 128 of EUM system 110 is described in U.S. patent application Ser. No. 15/936,225, filed Mar. 26, 2018, the entire disclosure of which is incorporated by reference herein.

Figure 2A:
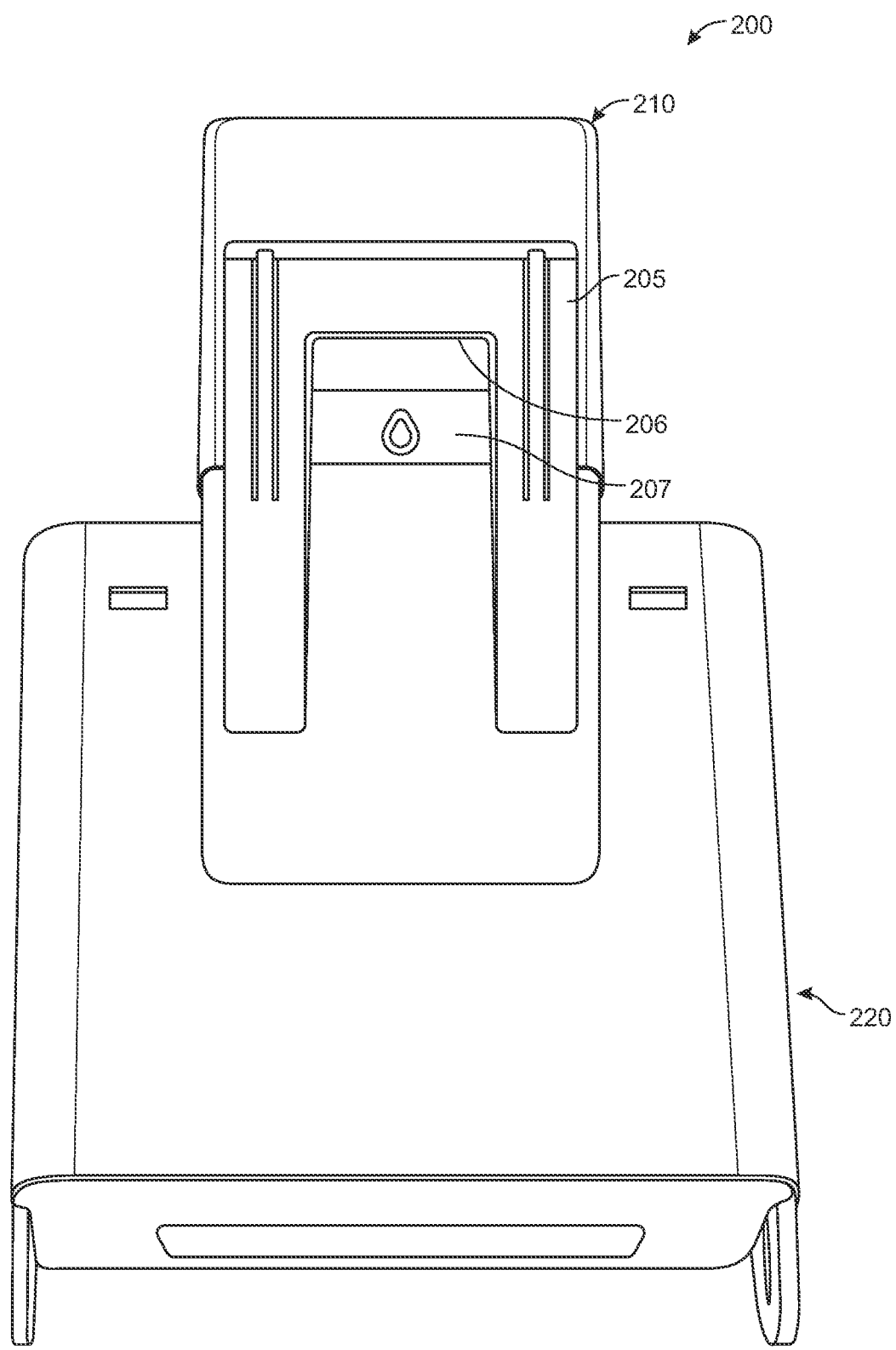
FIG. 2A is a front view of a housing of a EUM system, according to some implementations.
Figure 2B:
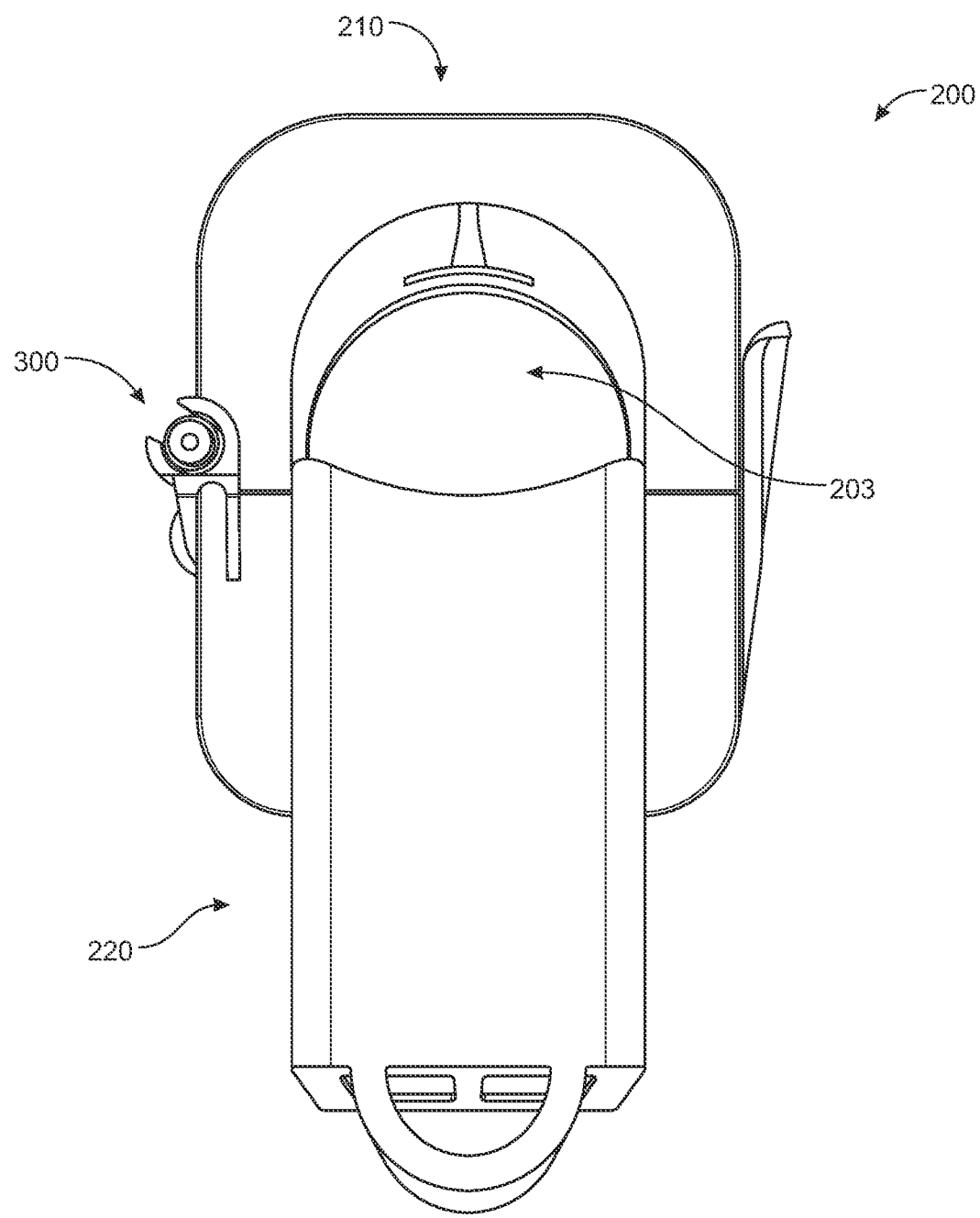
FIG. 2B is a side view of the housing of a EUM system, according to some implementations.
Figure 2C:
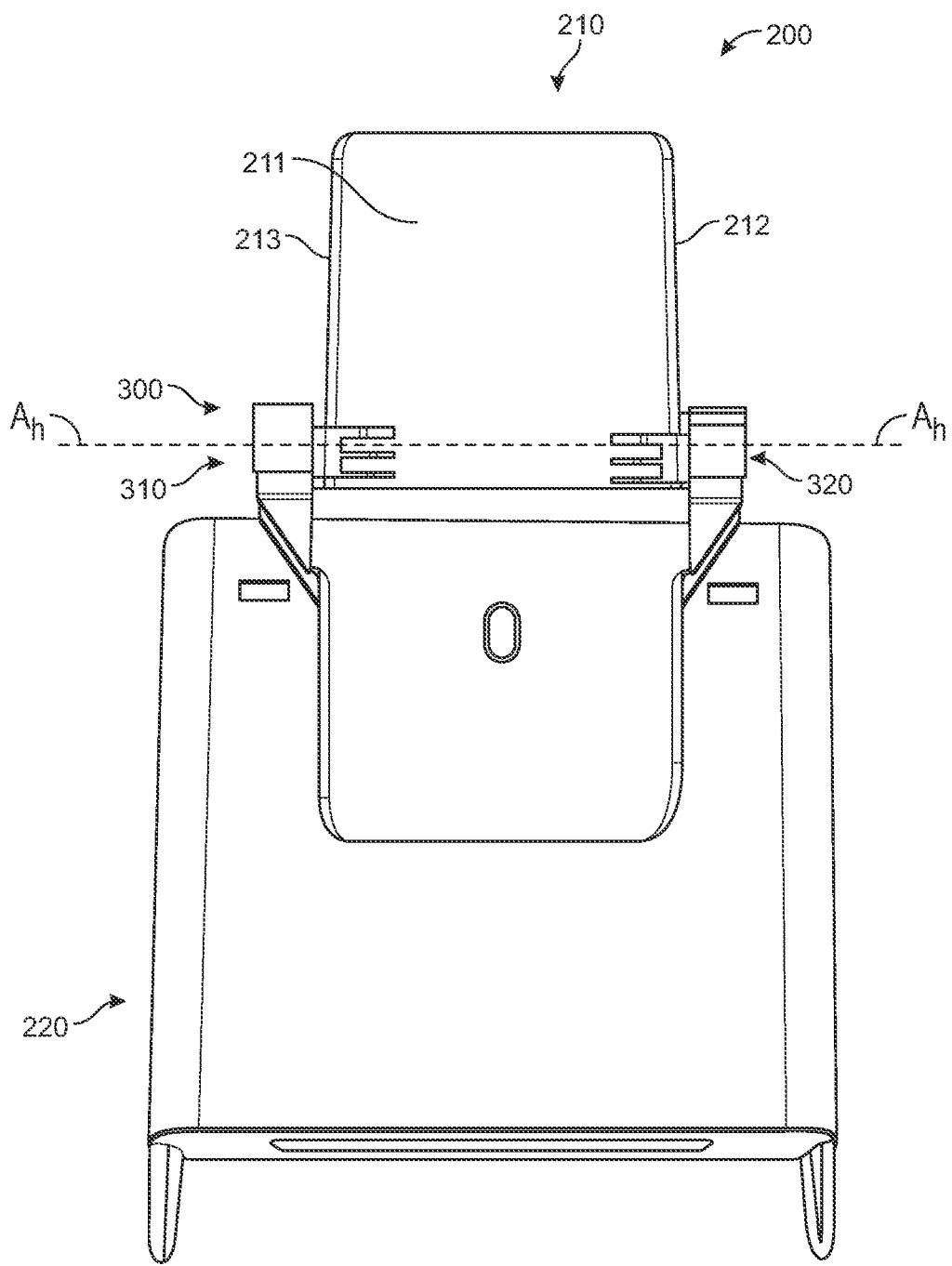
FIG. 2C is a rear view of the housing of a EUM system, according to some implementations.

FIGS. 2A (front view), 2B (side view), and 2C (rear view) are various views of a housing 200 in connection with the EUM system 110 of FIG. 1B, according to some implementations. FIGS. 2A, 2B, and 2C show the housing 200 in a closed configuration. The housing 200 may comprise two housing parts: the upper housing part 210 and the lower housing part 220. In the illustrated embodiment of FIGS. 2A, 2B, and 2C, the housing 200 may include the upper housing part 210 and the lower housing part 220, both of which may be injection-molded plastic parts. Furthermore, any and all components of the upper housing part 210 and the lower housing part 220 may be integrally molded portions of the upper housing part 210 and/or the lower housing part 220. The upper housing part 210 and the lower housing part 220 are coupled together via a hinge 300 disposed at one side (e.g., a rear) of the housing 200. Accordingly, the hinge 300 may facilitate the housing 200 being selectively disposed in the closed configuration as shown in FIG. 2A and an open configuration. The upper housing part 210 may comprise a latch 205 that may be disposed at another side (e.g., the front opposite the hinge 300) of the housing 200. Manipulation of the latch 205 may facilitate the housing 200 being selectively transitioned from an unlatched configuration to a latched configuration when the housing 200 is disposed in the closed configuration. In some embodiments, the latch 205 may be configured to automatically transition the housing 200 from the unlatched configuration to the latched configuration upon full closure of the housing 200. For example, the latch 205 may be biased toward a latched configuration such that upon a lip 206 of the latch 205 passing over an edge of a protrusion 207, the latch 205 springs into place with the lip 206 engaging the edge of the protrusion 207. Similarly, the latch 205 may be manipulated to transition the housing 200 from the latched configuration to the unlatched configuration. For example, the latch 205 may be forced or bent outward to disengage the lip 206 from the protrusion 207 to release engagement.

The housing 200 is configured to receive electrical components of a split-core CT. The electrical components may include a pair of magnetic core halves, which define the split-core portion of the CT. The magnetic core halves may be disposed inside the housing 200 such that one magnetic core half is disposed in the upper housing part 210 and the other magnetic core half is disposed in the lower housing part 220. The magnetic core halves may be U-shaped (or, C-shaped, half-ring-shaped, or other similar shape comprising or forming a partial cutout) so as to define an entirely enclosed or surrounded opening through the magnetic core halves when the ends of the magnetic core halves are aligned and coupled together. The opening may be configured to receive one or more conductors of electricity (e.g., wires) such that the magnetic core halves extend entirely around the one or more conductors. The opening through the magnetic core halves may at least partially align with an opening 203 of the housing 200 defined by the upper housing part 210 and the lower housing part 220. The opening 203 is correspondingly configured to receive the one or more conductors therethrough. The upper housing part 210 and the lower housing part 220 are configured to align and couple the magnetic core halves together when the housing 200 is disposed in the closed configuration.

As will be described more fully, the hinge 300 is unlikely to inadvertently come apart, "unsnap," or otherwise disassemble. Presently available housings, such as for a split-core CT, are likely to unsnap or otherwise come apart when an attempt is made to install the housing (and split-core CT) around a conductor that is too large for the opening 203. The embodiments of the present disclosure, with the hinge 300, are more likely to remain intact during such attempt to install around a conductor that is too large.

As shown in FIG. 2C, the upper housing part 210 comprises an end wall 211, a side wall 212, and an opposing side wall 213 opposite the side wall 212. The hinge 300 comprises a first hinge part 310 and a second hinge part 320 (e.g., a keyed hinge part), both of which are disposed on or at a hinge axis Ah and are configured for rotation about the hinge axis Ah. As shown, the first hinge part 310 is disposed adjacent an outside surface of the opposing side wall 213 and the second hinge part 320 is disposed adjacent an outside surface of the opposing side wall 212.

Figure 3A:
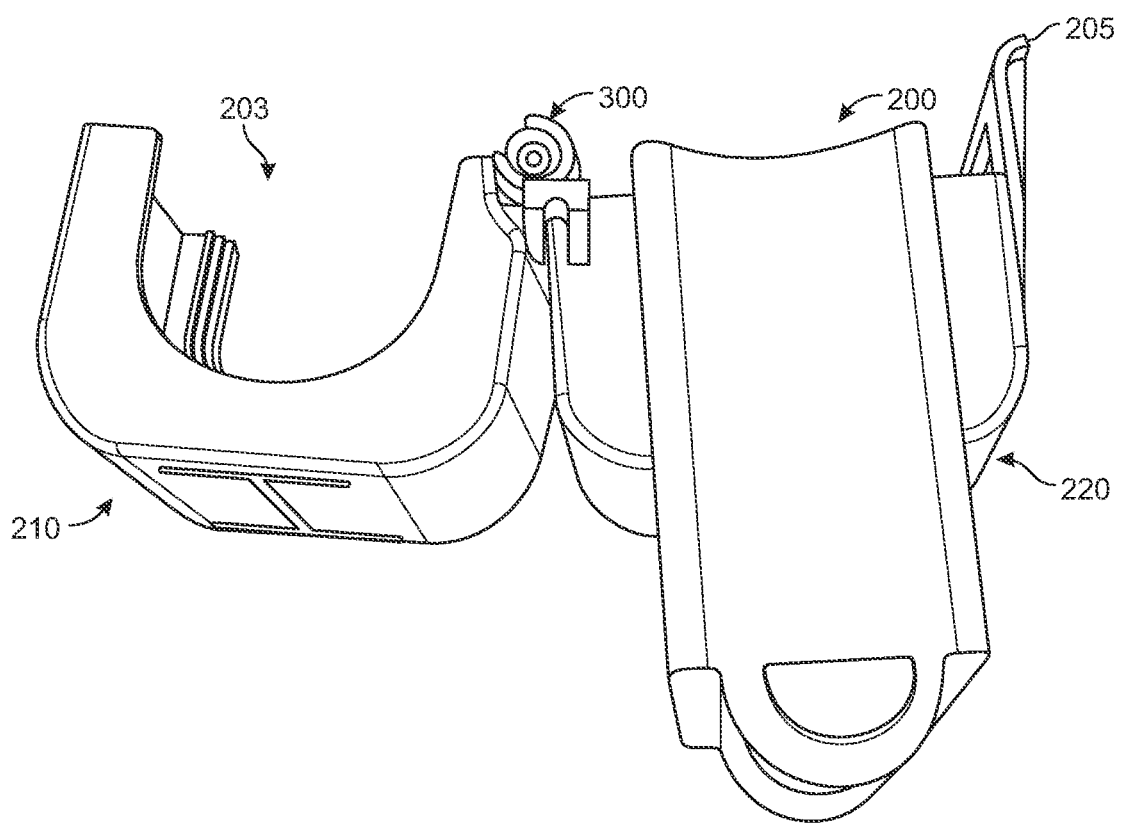
FIG. 3A is a side view of the housing of FIG. 2A in an open configuration, according to some implementations.

FIG. 3A is a side view of the housing 200 of FIG. 2A in an open configuration, according to some implementations. The upper housing part 210 may be rotated with respect to lower housing part 220 about the hinge axis Ah by about 180 degrees so as to open the housing 200. By rotating 180 degrees to an open configuration (e.g., a fully open configuration), unimpeded access to the partial cutouts of the magnetic core halves is afforded. When the housing 200 is disposed in a fully open configuration, the housing 200 may more readily receive the one or more conductors in the opening 203 than if the housing 200 were incapable of fully opening or otherwise disposed in a less than a fully open configuration (e.g., less than 280 degrees). In some instances, characteristics of the one or more conductors such as quantity, stiffness, size, and position in relation to other objects may present difficulty to the user enclosing the one or more conductors within the opening 203 of the housing 200. Hence, disposing the housing 200 in a fully open configuration and thereby making the opening 203 (and cutouts of the magnetic core halves) fully accessible in at least one direction may be advantageous to the user. For example, the user may position the one or more conductors adjacent the open end of the lower housing part 220 and then rotate the upper housing part 210 toward the closed configuration. Similarly, the user may position the one or more conductors adjacent the opening 203 defined by the upper housing part 210 and then rotate the lower housing part 220 toward the closed configuration.

Figure 3B:
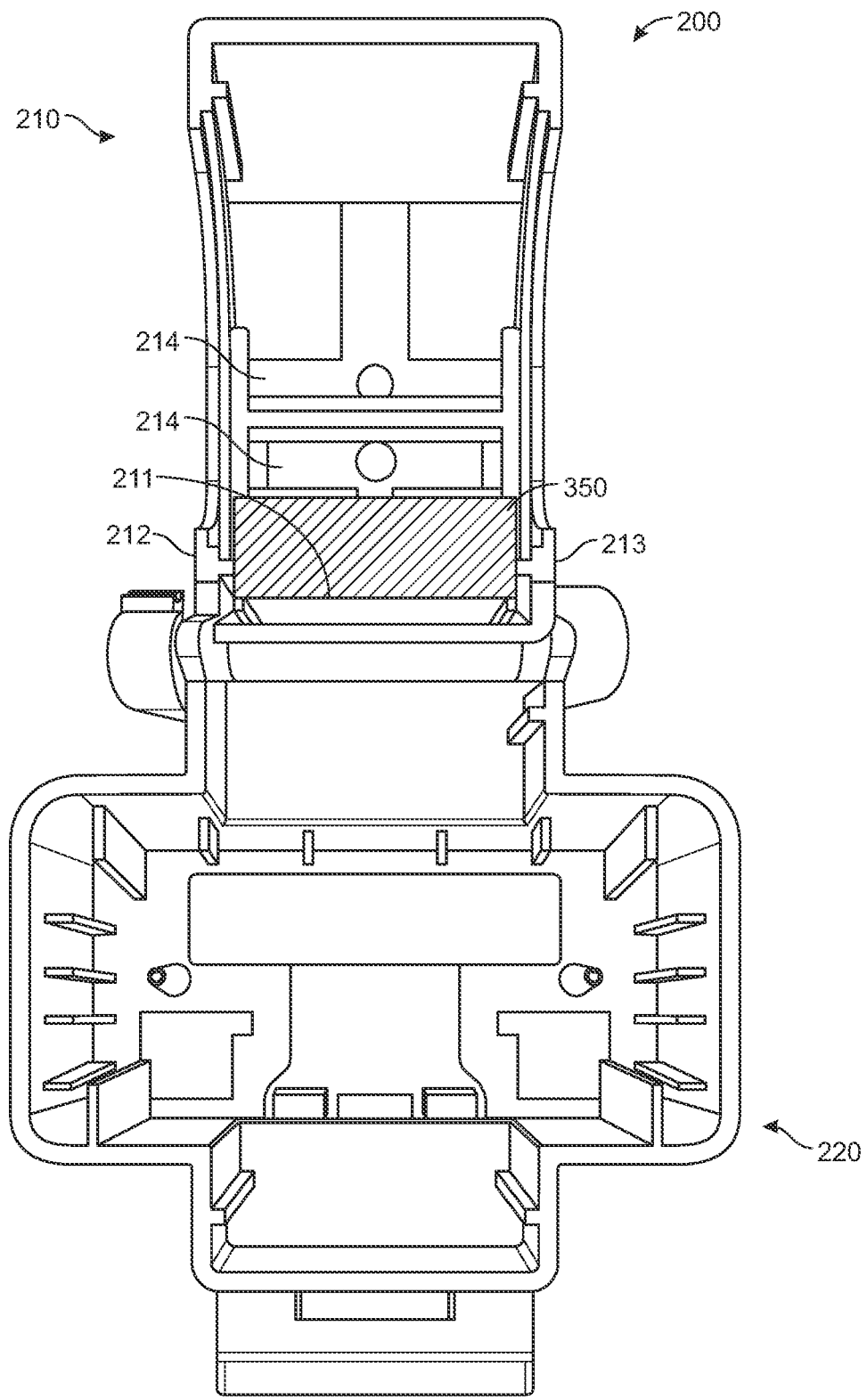
FIG. 3B is a top view of the housing of FIG. 2A in an open configuration, according to some implementations.

FIG. 3B is a top view of the housing 200 of FIG. 2A in an open configuration, according to some implementations. Also shown for reference is a portion of a magnetic core half 350 as may be disposed in the upper housing part 210. As shown, the magnetic core half 350 may be disposed adjacent the end wall 211 and between the side walls 212, 213. The upper housing part 210 may comprise one or more biasing members 214. The biasing members 214 may exert a force on the magnetic core half 350 disposed in the upper housing part 210 toward a corresponding magnetic core half (not shown) disposed in the lower housing part 220 to ensure that the two magnetic core halves are secured flush together when the housing 200 is in the closed configuration. In the illustrated embodiment, the biasing members 214 may comprise flexible portions of the upper housing part 210.

Figure 4:
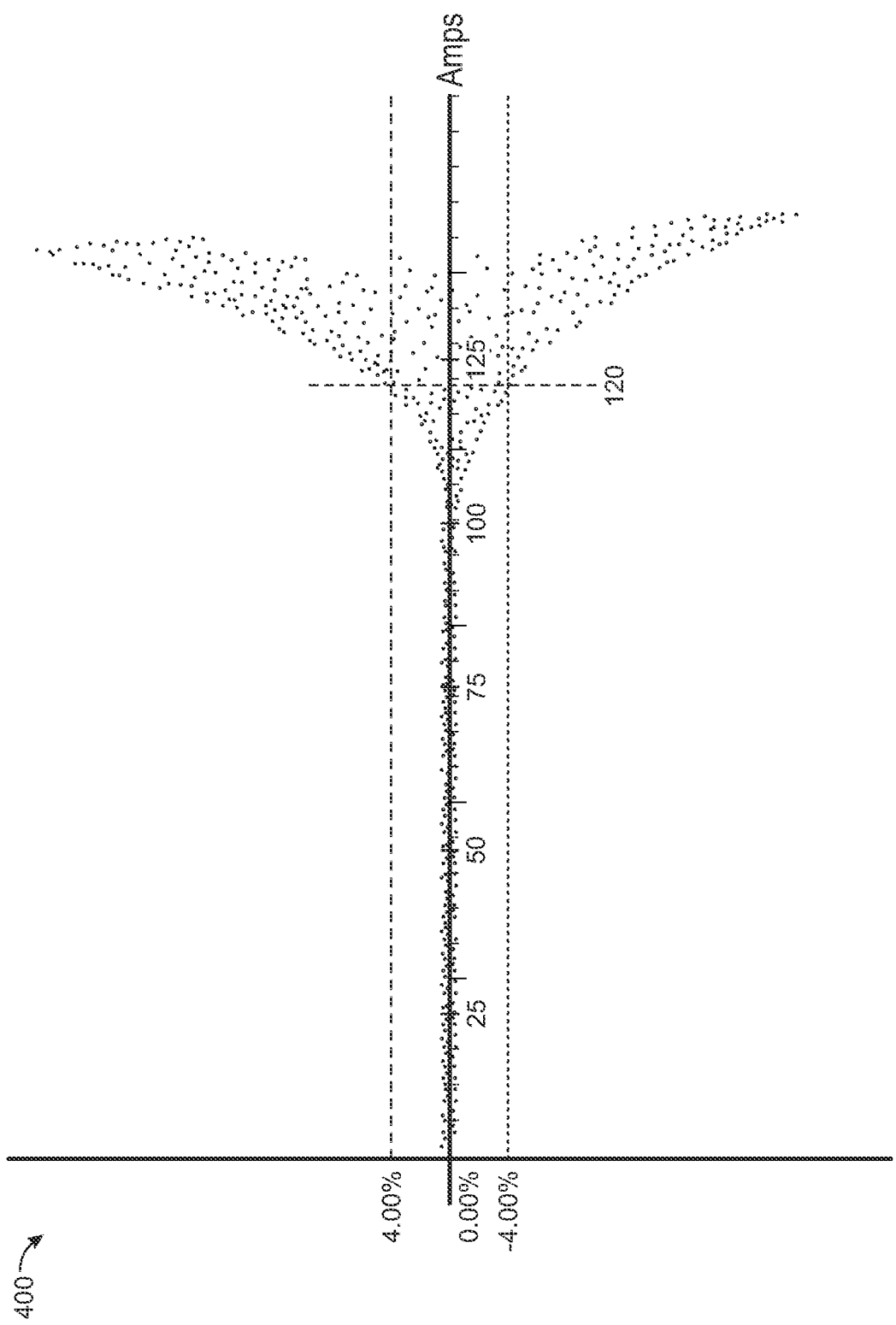
FIG. 4 is an example error plot of a current measurement device, according to some implementations.

FIG. 4 is an example error plot 400 in connection with a current measurement device, according to some implementations. In particular, unlike the EUM system 110 described herein, the current measurement device is an iron (ferrite) core CT that is typically used when attempting to measure current in an energy source. As shown, a plot of a ratio error iron (ferrite) core CT is in the shape of a trumpet (+/−). Stated differently, a theoretical formula for the ratio error can be (Formula 1):

$$iP = iS(n) \times |1-x|$$

where iP denotes the primary current, iS denotes the secondary current, n denotes the number of windings of the CT, x denotes plus (+) or minus (−) the ratio error, and x begins to randomly fall outside of an acceptable threshold.

The trumpeting of the ratio error is shown in both the positive (plus) and negative (minus) regions. As shown in the example error plot 400, the random trumpeting of the ratio error above 120 Amps makes the top-end limit (+/−4%) of the current measuring device 120 Amps. The ratio error begins to be randomly outside the acceptable threshold (shown in dashed lines) above 120 Amps. That same saturation in the secondary windings that causes the error may be caused by escalating temperatures that fall outside of safe ranges (e.g., +40° above ambient temperature can be deemed unsafe, according to UL). That is, as shown with reference to FIG. 4, a 100 Amp rated product could plot within a 4% ratio error up to its top end (e.g., 120% of a UL rating for the CT) and exhibit measurement errors greater than 4% above the top end (e.g., at 125 Amps and above). As such, a typical current measuring device would start to plot outside area 440 when measuring current beyond the top-end limit.

Figure 5:
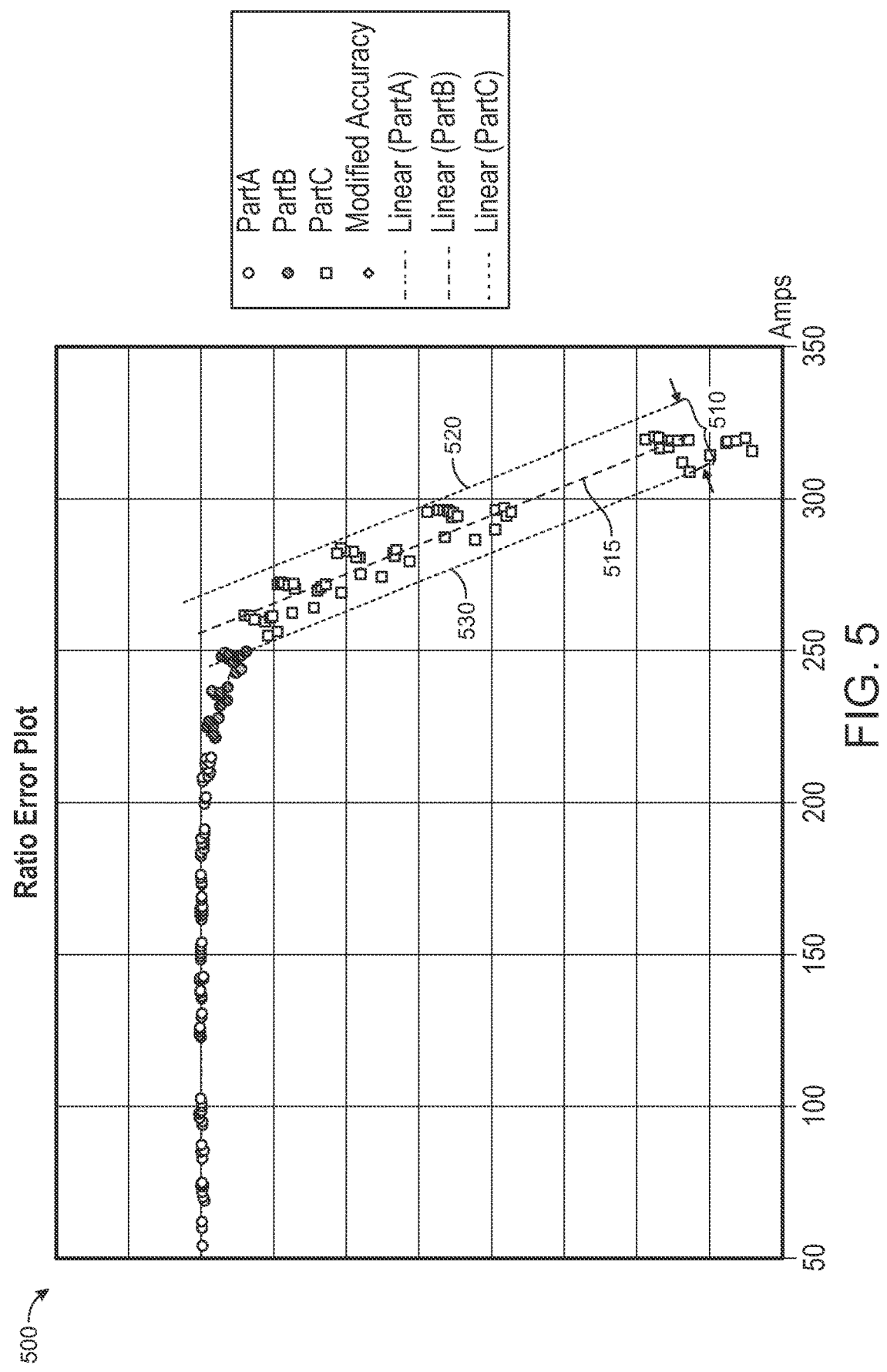
FIG. 5 is an example error plot of a EUM system, according to some implementations.
Figure 6:
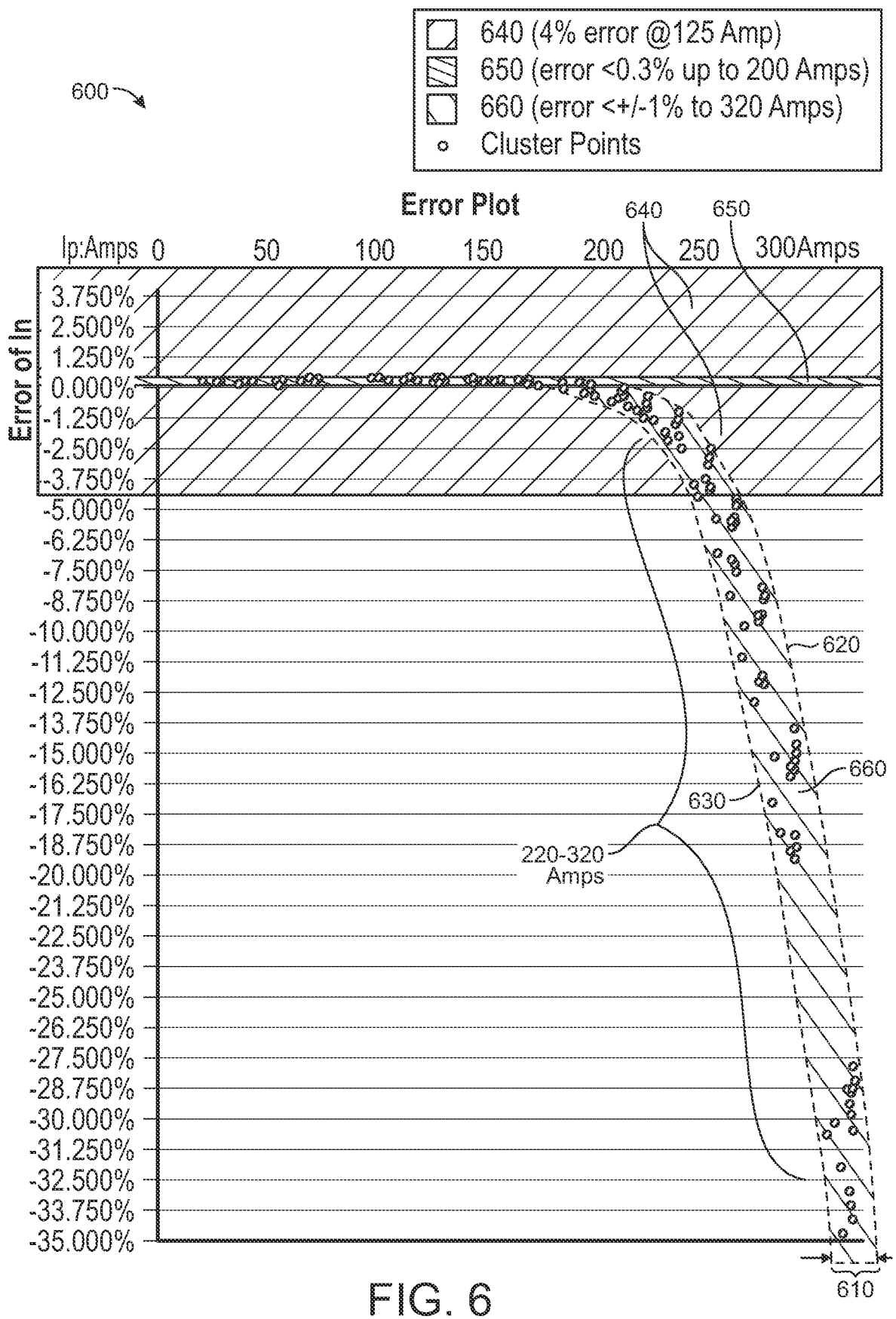
FIG. 6 is another example error plot of a EUM system, according to some implementations.

FIGS. 5 and 6 show example error plots 500, 600 in connection with a EUM system, according to some embodiments, such as the EUM system 110 of FIG. 1B. The ratio error plot produced by a current measuring device having a CT composed of advanced nano-layered materials has a different "hockey-stick" pattern versus the trumpet-shaped plot of FIG. 4. These nano-layered materials in a CT-based current measurement device (e.g., the EUM system 110) produce a consistent and predictable ratio error along a common negatively sloped axis. The CT measurements up to a rating or similar threshold (e.g., 220 Amps) (collectively plotted as "Part A" in FIG. 5) are highly accurate, as each point of the ratio error plot is close to a linear axis. The CT measurements between in a next range above the rating or threshold and to a top-end limit (e.g., between 220 Amps to 250 Amps) (collectively plotted as "PartB" in FIG. 5) begin to manifest error, and yet produce a consistent and predictable ratio error along a first common negatively sloped axis 513. The CT measurements in a next range, above a top-end limit (e.g., above 250 Amps) (collectively plotted as "PartC" in FIG. 5) produce a consistent and predictable ratio error along a common negatively sloped axis, or line fit axis 515, that appears as shown in the plot of FIG. 5. A similar negatively sloped band, for example, is depicted in the plot of FIG. 6. As shown in the ratio error plots 500, 600 of FIGS. 5 and 6, the ratio error is consistently predictable (i.e., repeatably within a fairly narrow and linear sample band 510 shown between linear guidelines 520 and 530 (collectively shown as "PartC"). Stated otherwise, a CT composed of a material that above a top-end limit provides predictable ratio error results (within a definable band along a line fit axis) that are repeatable over multiple tests can be utilized with disclosed embodiments, which can expand usable accurate readings above the top-end limit of the CT Additionally, the present industry standard characterizes "accurate" as being within a 4% ratio error (shown as area 640 in FIG. 6). In contrast to FIG. 4, the ratio error plot of a nano-layered CT is within area 650 which is less than 0.4% error. As shown, the ratio error plot 600 of FIG. 6 illustrates that the nano-layered CT ratio error is less than 0.4% up to approximately 200 Amps. Beyond 200 Amps, rather than a trumpet pattern (as shown in FIG. 4), the ratio error plot of the nano-layered CT displays a notable linear pattern where a line-fit can mathematically describe the declination as a function of the primary current. The pattern of the ratio error plot can be described as predictable, and as near linear as reflected by the linear banding at +/−1% width, which is shown as area 660.

Figure 7A:
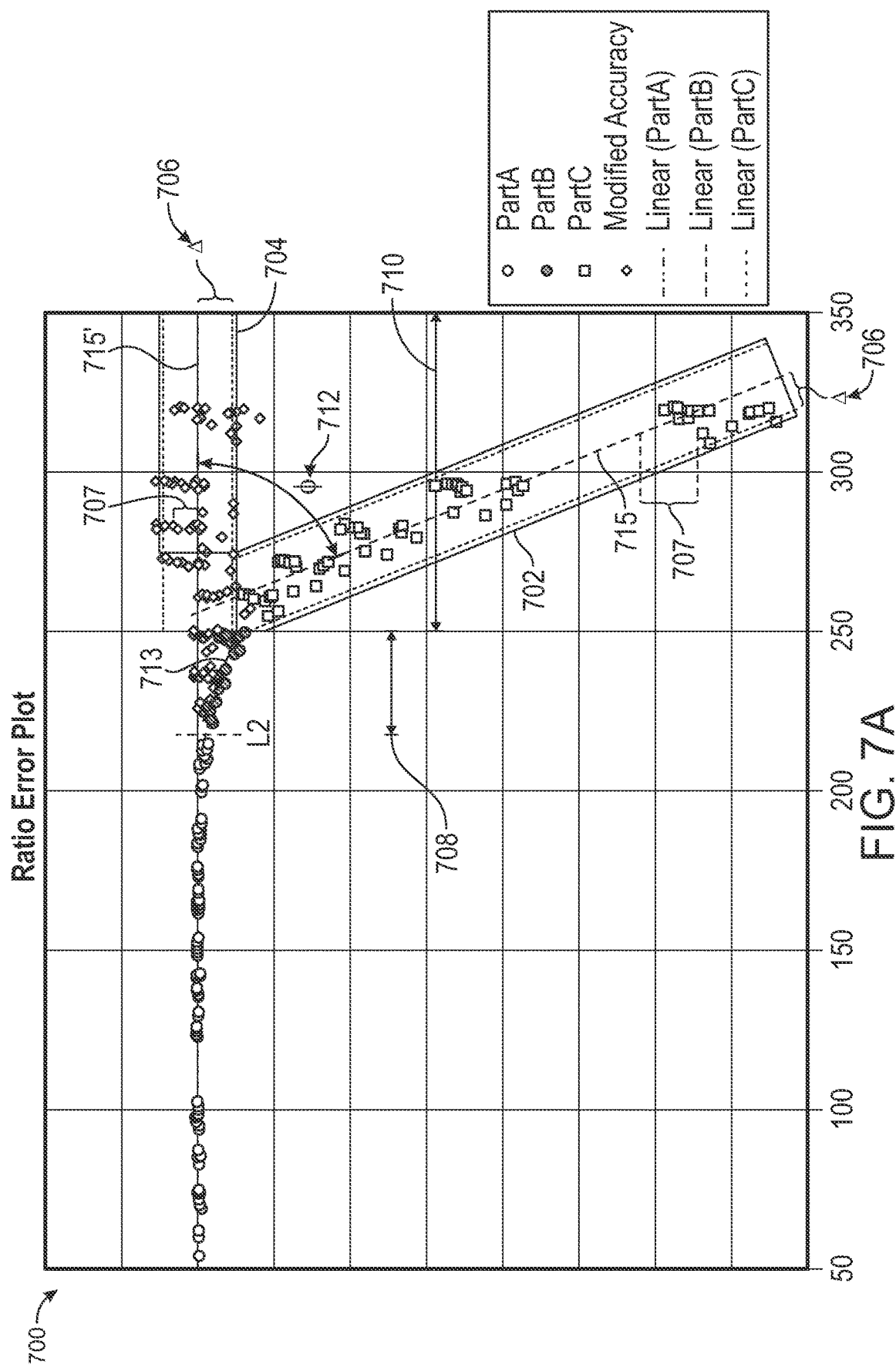
FIG. 7A is an example transformation plot in connection with the error plots of FIGS. 5-6, according to some implementations.

FIG. 7A is an example ratio error plot 700 with a transformation, in connection with a ratio error plot of a EUM system, according to some implementations, such as the ratio error plots 500, 600 of FIGS. 5-6. FIG. 7A depicts the transposition of the ratio error plot points above the top-end limit into the same reference axis as the reference axis of the ratio error plot points below the top-end limit. More particularly, FIG. 7A depicts the error data according to a line fit axis 715 transposed to a reference axis 715' that aligns with the reference axis below the top-end limit. As can be seen in FIG. 7A, for measurements under 220 Amps (e.g., a first current area), the reference axis of the ratio error plot below the top-end limit is the x-axis of the chart (i.e., the line y=0). Measurements from 220 Amps to 250 Amps as plotted demonstrate predictability and a first line fit can be made for points within the range 220-250 Amps (e.g., a second current area 708) with a first line fit axis 713 that has a first negative slope. Measurements above 250 Amps as plotted demonstrate predictability and a second line fit can be made for points in the range above 250 Amps (e.g., a third current area 710) with a second line fit axis 715 that has a negative slope. The ratio error plot points within the range 220-250 Amps can be transposed such that the first line fit axis 713 aligns (or substantially aligns and/or is parallel) with the x-axis of the chart and the ratio error plot points above 250 Amps can be transposed such that the second line fit axis 715 aligns (or substantially aligns and/or is parallel) with the x-axis 715' of the chart. In this manner, the ratio error data above the top-end limit is transposed into the same reference axis 715' as the ratio error plot below the top-end limit. This transposition allows for increasing the upper bound of accurate measurements. For example, the upper bound can be increased from the top-end limit of 120 Amps all the way up to 400 Amps. The transposition is to recast or otherwise change the data set to clearly enable or otherwise allow inferring (e.g., formulaically or mathematically "backing into") the primary current. As such, this can reduce the need to manufacture CT current measurement devices rated between 100 Amps and 400 Amps.

In some implementations, multiple current areas can be determined and designated by a modeler (e.g., the current modeler 122 of FIG. 1B). In particular, current areas on the error plot 700 can be current ranges between two x-coordinates of the error plot 700. For example, current area 708 can be between 220 Amps and 250 Amps (corresponding to PartB of the plot). In another example, current area 710 can be between 250 Amps and 350 Amps (corresponding to PartC of the plot). Also as shown is a plotted ratio area 702 including a plurality of ratio error points (e.g., data points) unmodeled by the transformation model. Additionally, as shown is a plotted ratio area 704 including a plurality of modified ratio error points (shown in FIG. 7A-7B as "modified accuracy" points) calculated and plotted based on transforming, by the current modeler 122, a current reading (i.e., ratio error points of plotted ratio area 702) to a corrected reading based on utilizing a transformation model to correct the reading to be within an acceptable ratio error. Accordingly, the data points of plotted ratio area 702 can be transformed by the transformation model to new data points of plotted ratio area 704. In FIG. 7A, the vertical distance 707 (y-coordinate distance) between the line fit axis 715 and points within the plotted ratio area 702 can be maintained from the new reference axis 715' after transformation to the modified accuracy plotted ratio area 704. In some implementations (e.g., see FIG. 7C), the distance or delta 706 between the line fit axis 715 and points within the plotted ratio area 702 can be maintained after transformation to modified accuracy plotted ratio area 704.

The angle 712 of rotation of the new reference axis 715', or the angle 712 between a line fit axis 715 and the original reference axis (e.g., the x axis or the line y=0), can be determined and can be used as a fixed design constant for a current measuring device. In FIG. 7A, the angle 712 of rotation between the second line fit axis 715 and the new reference axis 715' (or x axis) is shown. Another angle of rotation between the first line fit and the x axis may also be determined and can be used as a fixed design constant for the current measuring device. The angle 712 may be used as a fixed design constant in the transposition algorithm or formula of the transformation modeler. In some embodiments, the transposition may be a matrix transposition using the angle 712 of rotation. In some embodiments, the angle 712 of rotation can be used to determine the perpendicular distance or delta 706 of a point to a line fit axis, such that the same delta 706 can be maintained at the new reference axis 715', as shown in FIG. 7C and described below with reference to the same.

Figure 7B:
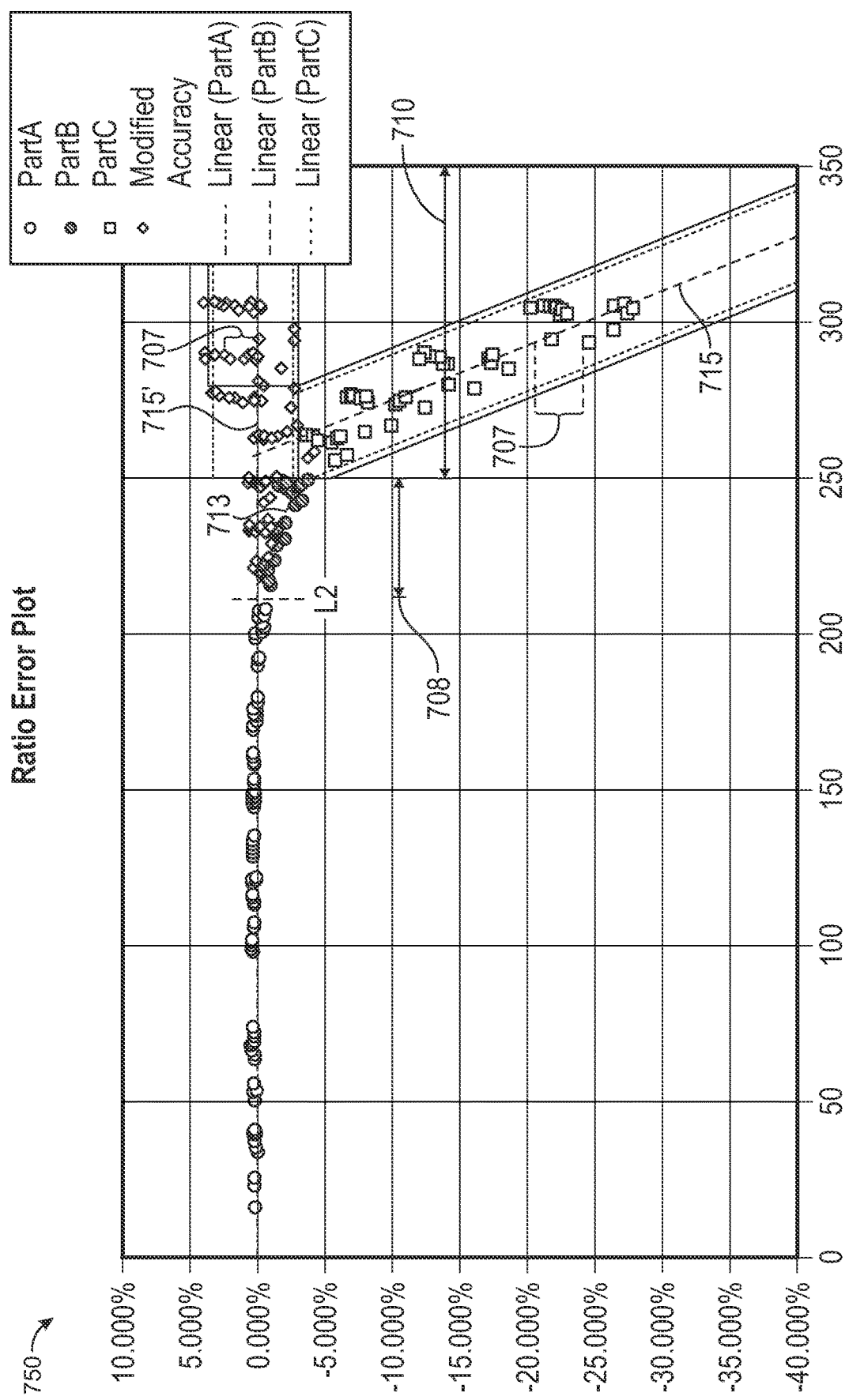
FIG. 7B is an enlarged view of the transformation plot of FIG. 7A.

FIG. 7B is a ratio error plot 750 that is an enlarged view of the ratio error plot 700 of FIG. 7A. The ratio error plot 750 of FIG. 7B more clearly depicts the current areas 708, 710, the line fit axis 715, and transposition of the error data set to a modified reference axis 715' that aligns with the reference axis of the ratio error plot below the top-end limit (e.g., the x axis). In FIG. 7B, it can be seen that a ratio error plot point is positioned along the x axis at the same horizontal position when transposed to the modified ratio error data. Also, in FIG. 7B, it can be seen that a ratio error plot point is positioned a vertical distance from the line fit axis 715 and that same vertical distance (i.e., y coordinate distance) is maintained in the transposed modified data. Stated otherwise, a vertical distance 707 (y-coordinate distance) between the line fit axis 715 and each point within the plotted ratio area 702 can be maintained for each corresponding modified point from the new reference axis 715' after transformation to the modified accuracy plotted ratio area 704. In some implementations (e.g., see FIG. 7C), the perpendicular distance or delta 706 between the line fit axis and points within the plotted ratio area 702 can be maintained after transformation to the modified accuracy plotted ratio area 704.

Figure 7C:
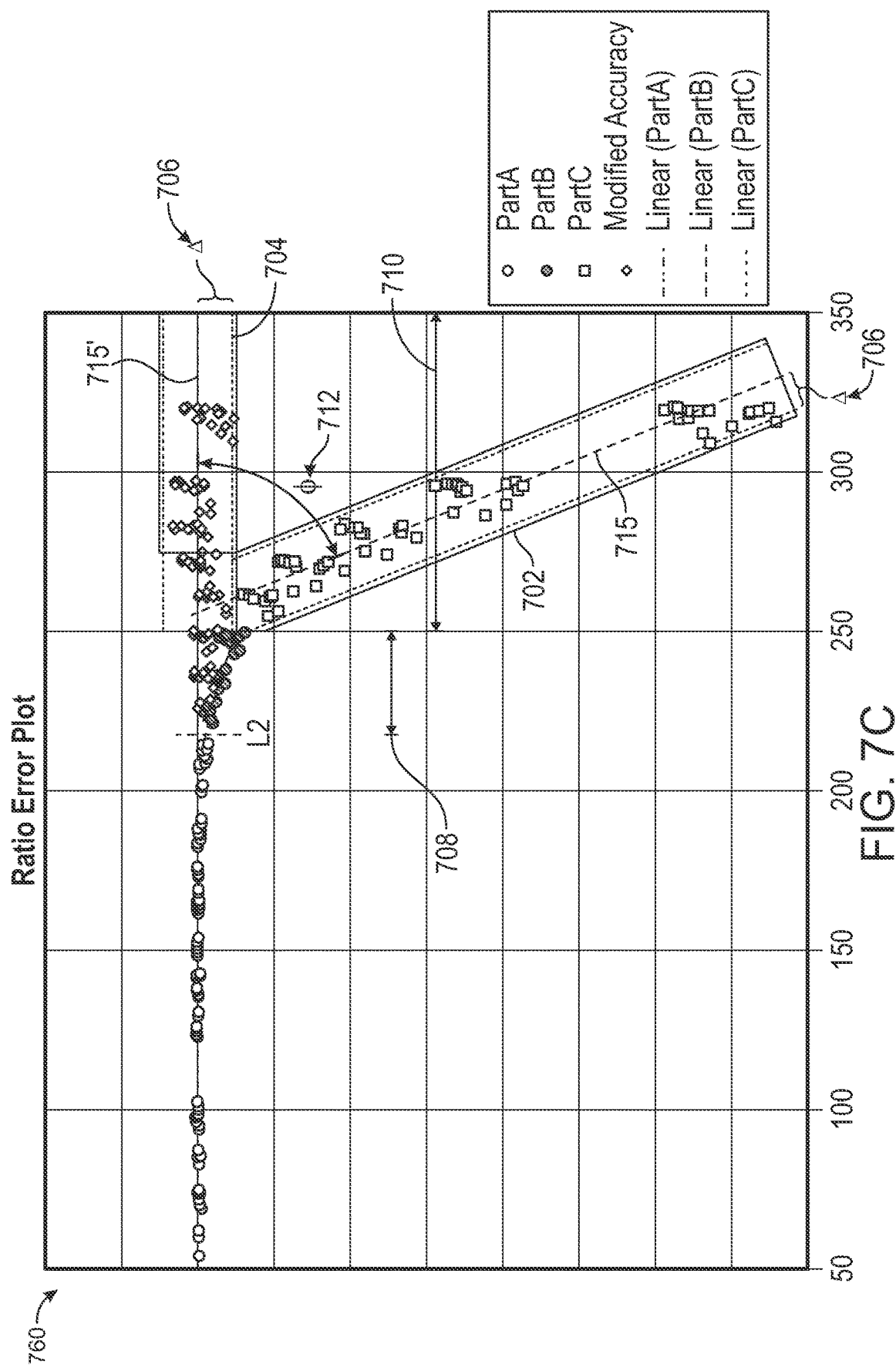
FIG. 7C is another example transformation plot in connection with the error plots of FIGS. 5-6, according to some implementations.

FIG. 7C is another example ratio error plot 760 with a transformation, in connection with a ratio error plot of a EUM system, according to some implementations, such as the ratio error plots 500, 500 of FIGS. 5-6, and 7A-7B. FIG. 7C depicts the transposition of the ratio error data above the top-end limit into the same reference axis as the reference axis of the ratio error plot below the top-end limit. More particularly, FIG. 7C depicts the error data according to a line fit axis 715 transposed to a new reference axis 715' that aligns with the reference axis (x axis) of unmodified ratio error data below the top-end limit. The transposition of the data to the new reference axis 715' may be accomplished by a different transformation model than the transformation model utilized in FIG. 7B. In FIG. 7C, it can be seen that a ratio error plot point is positioned along the x axis at the same horizontal position when transposed to the modified ratio error data. Also, in FIG. 7C, it can be seen that a ratio error plot point is positioned a perpendicular distance 706 from the line fit axis 715 and that same perpendicular distance from the reference axis is maintained for each corresponding point in the transposed (modified) data. Stated otherwise, a perpendicular distance between the line fit axis 715 and points within the plotted ratio area 702 can be maintained from the new reference axis 715' after transformation to the modified accuracy plotted ratio area 704.

FIG. 7D is another example ratio error plot 770 with a transformation, in connection with a ratio error plot of a EUM system, according to some implementations, such as the ratio error plots 500, 500 of FIGS. 5-6, 7A-7B, and 7C. FIG. 7D depicts the transposition of the ratio error data above the top-end limit into the same reference axis as the reference axis of the ratio error plot below the top-end limit. More particularly, FIG. 7C depicts the error data according to a line fit axis 715 transposed to a new reference axis 715' that aligns with the reference axis (x axis) of unmodified ratio error data below the top-end limit. The transposition of the data to the new reference axis 715' may be accomplished by a different transformation model than the transformation model utilized in FIG. 7B. In FIG. 7C, it can be seen that a ratio error plot point is positioned along the x axis at the same horizontal position when transposed to the modified ratio error data. Also, in FIG. 7C, it can be seen that a ratio error plot point is positioned a perpendicular distance 706 from the line fit axis 715 and that same perpendicular distance from the reference axis is maintained in the transposed (modified) data. Stated otherwise, a perpendicular distance between the line fit axis 715 and points within the plotted ratio area 702 can be maintained from the new reference axis 715' after transformation to the modified accuracy plotted ratio area 704.

Figure 8A:
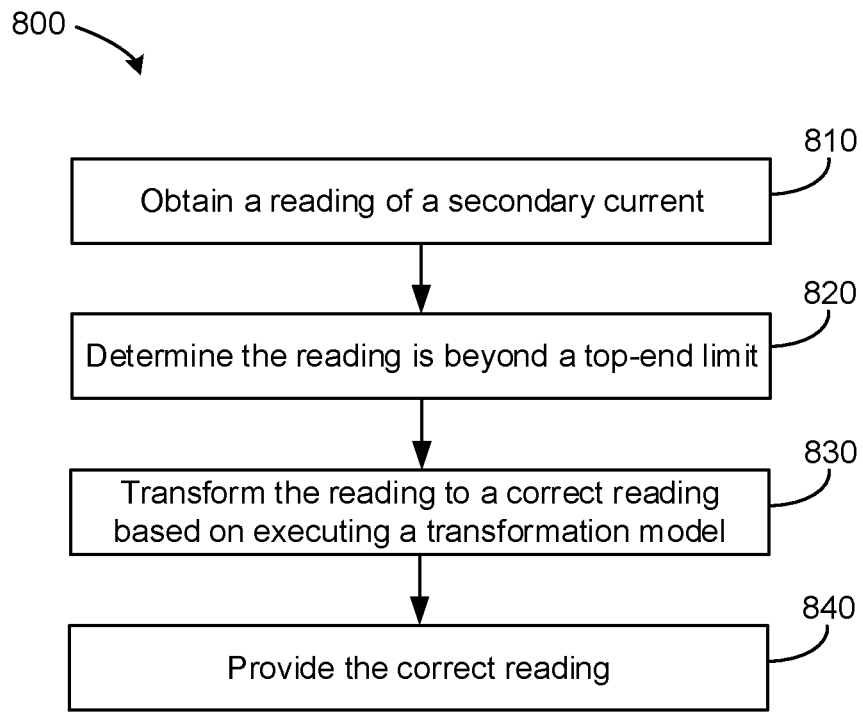
FIG. 8A is a flowchart of a method for monitoring electricity usage of an electrical circuit, according to some implementations.

FIG. 8A is a flowchart of a method 800 for monitoring electricity usage of an electrical circuit, according to some embodiments. A EUM system (e.g., the EUM system 110 of FIG. 1A-1B) can be configured to perform method 800. Further, any computing device described herein can be configured to perform method 800.

In broad overview of method 800, at block 810, a EUM system can obtain a reading of a secondary current. At block 820, the EUM system can determine that the reading is beyond a top-end limit. At block 830, the EUM system can transform the reading to a corrected reading based on executing a transformation model. At block 840, the EUM system can provide the corrected reading. Additional, fewer, or different operations may be performed depending on the particular implementation. In some embodiments, some, or all operations of method 800 may be performed by the EUM system executing on one or more computing devices, systems, or servers. In various embodiments, each operation may be re-ordered, added, removed, or repeated.

Referring to method 800 in more detail, at block 810 the EUM system can obtain (e.g., by the measuring system 128 of EUM system 110) a reading of a secondary current (iS) induced in the EUM system by a primary current (iP) of a monitored source, the EUM system including an advanced nano-layered material that operates at low temperatures disproportionate to saturation levels, and the EUM system having a top-end limit beyond which physical limitations of the EUM system cause the reading to include an error outside an acceptable ratio error. In some implementations, the EUM system is magnetically coupled to the monitored source. Additionally, the thermally stable EUM system can be coupled (e.g., by the coupling system 126) around an energy source (e.g., the wire 104 from the electricity supply 102) with fluctuating changes of current results in a range spectrum of Amps that can be interpreted and analyzed accurately (e.g., being within 4% ratio error) from 10 milliamps to 400 Amps.

In some implementations, the EUM system includes a CT in which a fluctuating secondary magnetic field is induced from a fluctuating monitored magnetic field in the monitored source and from which the reading of the fluctuating monitored magnetic field is obtained based on the fluctuating secondary magnetic field. Additionally, the advanced nano-layered material produces an error plot (e.g., plotted ratio error described in block 830) including a linear pattern associated with at least one of a declination as a function of the iS or approximately linear as reflected by a linear banding. In some implementations, the EUM system can be configured to permit coupling to and decoupling from the monitored source without modification of the monitored source affecting operation of the monitored source and without affecting operation of any electrical component of the monitored source.

At block 820, the EUM system can determine the reading is beyond the top-end limit of the EUM system. In various implementations, the current modeler 122 of the EUM system can obtain the reading (or readings) of the secondary current and can compare the accuracy of the secondary current reading to a theoretical mathematical function. For example, the theoretical mathematical function can be (Formula 2):

$$iS = \frac{iP}{n}$$

where iP denotes the primary current, iS denotes the secondary current, and n denotes the number of windings of the measuring system 128 (e.g., CT).

It should be understood that the primary current (iP) is typically not known, and the EUM system is attempting to determine the primary current based on a reading of the secondary current. As shown, the primary current can be detected and/or determined by the inverse function of Formula 2 (e.g., iP=iS×1500). Additionally, a measuring system (e.g., the measuring system 128 of the EUM system 110) can include a coil wound around a single primary loop (e.g., the split core can be a first loop) with a ratio. For example, the ratio can be 1:2500 when one measuring system 128 (e.g., CT) split core includes 2500 wire coils wrapped around it. In another example, the ratio can be 1:2200 when one measuring system 128 (e.g., CT) split core includes 2200 wire coils wrapped around it. In yet another example, the ratio can be 1:3100 when one measuring system 128 (e.g., CT) split core includes 3100 wire coils wrapped around it. For simplicity purposes, the graphs and charts provided herein present measurements based on a ratio of 1:2500, but it should not be understood as requiring such ratio. The difference from the true primary current and the derived primary current (e.g., current derived from the secondary current in Formula 2) can incorrectly appear as an increase of the ratio or decrease of the ratio (e.g., a negative ratio error could appear to be 1:2600). For example, the ratio of derived primary current may be incorrect because the windings have so much resistance that they act like a longer set of windings than they really are. As used herein, a "ratio error" can be the difference in a derived ratio compared to a theoretical formula ratio. Accordingly, the ratio error is the departure of the value of the secondary current reading (obtained in block 810) from a calculated theoretical reading, Formula 2 (e.g., assuming no resistance or saturation of the windings or the magnetic core).

In some implementations, a top-end limit can be identified (e.g., querying the EUM database 120) or determined such that any secondary current reading that is outside the top-end limit is outside an acceptable ratio error (e.g., 4% ratio error). In various implementations, the EUM system can chart (or graph) the error function (e.g., ratio error) for each reading to confirm a predictable and repeatable pattern. Additionally, the EUM system can chart the error function for each reading to confirm a predictable and repeatable pattern. The pattern is predictable if a line fit axis can be determined and a corresponding line fit band and the pattern is repeatable if similar predictability is repeatable over multiple repeated tests. The predictability can be particularly useful if the line-fit band is the same size or smaller than a desired error band.

At block 830, the EUM system can transform the reading to a corrected reading based on utilizing a transformation model to correct the reading to be within the acceptable ratio error. In some implementations, when saturation of the measuring system 128 is starting to occur (e.g., above 200 Amps), the current modeler 122 can perform a transformation (sometimes referred to herein as a "distortion") by modeling the transformation function. In particular, the current modeler 122 of the EUM system can transform a ratio error above the acceptable ratio error in a reference frame into a new reference frame that fits (e.g., aligns linearly) the new reference frame of the ratio error plane below or within the acceptable ratio error. In general, the current modeler 122 can input one or more secondary current readings into the transformation model and receive an output from the transformation model providing a corrected reading. The utilization of the transformation model by the current modeler 122 can include modeling a transformation function of a ratio error for a reading of one or more of the readings (e.g., collected or obtained in block 810). In some implementations, the ratio errors can be adjusted based on a rotation without skewing (e.g., maintaining the perpendicular distance) the data points (i.e., plotted ratio error points). The rotation can include determining (e.g., by the current modeler 122) a reference (or base) rotation based on generating a line fit of the plotted ratio error to determine an orientation to the y-axis (exactly vertical) and in turn, determine a degree offset of the matrix based on the orientation to the y-axis. In some implementations, the rotated plotted ratio errors can also be squeezed such that the points are also transposed towards 0 Amps without the plotted ratio error points deviating in a perpendicular manner. Additional details relating to the determination/generation of the transformation functions are described with reference to FIG. 8B.

Accordingly, the transformation model can provide improved accuracy of ratio errors that utilizes line fits, error plots, and transformation functions, while maintain a safe operating temperature (e.g., with a threshold) of the EUM system. In some implementations, the secondary current can be harvested into capacitors of the EUM system to power the processing circuit 114 and transmit data by the network interface 112 to other systems described herein. Thus, the transformation model also improves current harvesting by maintaining the ability to harvest the secondary current without pushing the EUM system into a saturation region (e.g., outside an acceptable ratio error such as +/−4%) and without causing the EUM system to deviate from a theoretical formula ratio.

In some implementations, the modeling the transformation function can be based on the value of the primary current determined by Formula 2 of block 820. In particular, empirical constants (e.g., below 220 Amps, between 220 and 250 Amps, greater than 250 Amps) can be determined. For example, if primary current is between 220 and 250 Amps a first transformation function can be utilized to recast, transpose, or otherwise transform the ratio error plot data based on an angle of rotation between a first line fit axis and a reference axis. And if primary current is above 250 Amps, a second transformation function can be utilized to recast, transpose, or otherwise transform the ratio error plot data based on an angle of rotation between a second line fit axis and a reference axis. In some embodiments, the first transformation function may be the same or similar to the second transformation function, differing only based on one or more fixed design constants, such as the angle of rotation between a respective line fit axis and a reference axis. In some embodiments, the first transformation function and second transformation functions may be different algorithms or formulas of a similar type (e.g., linear transformation, spatial transformation, matrix transformation) or may be different algorithms or formulas each of a different type.

The errors in the data set (e.g., ratio errors) can be interpreted by the current modeler 122 as an error function that is predictable even beyond the saturation level of current measuring devices (e.g., EUM system 110) because of the combination of, but not limited to, thermal properties and the impedance of the EUM system. Accordingly, modeling the transformation function improves current measuring devices and enables highly conductive and low impedance (e.g., thermally stable) current measuring devices using a nano-layered material (e.g., silicon carbide) to have an extended range of accuracy in providing readings.

At block 840, the EUM system can provide the corrected reading into a communication network. In some implementations, the EUM system can provide the corrected reading to the systems described herein (e.g., the monitoring system 150, the user device 140), via the network 130 and/or the hub 160.

Figure 8B:
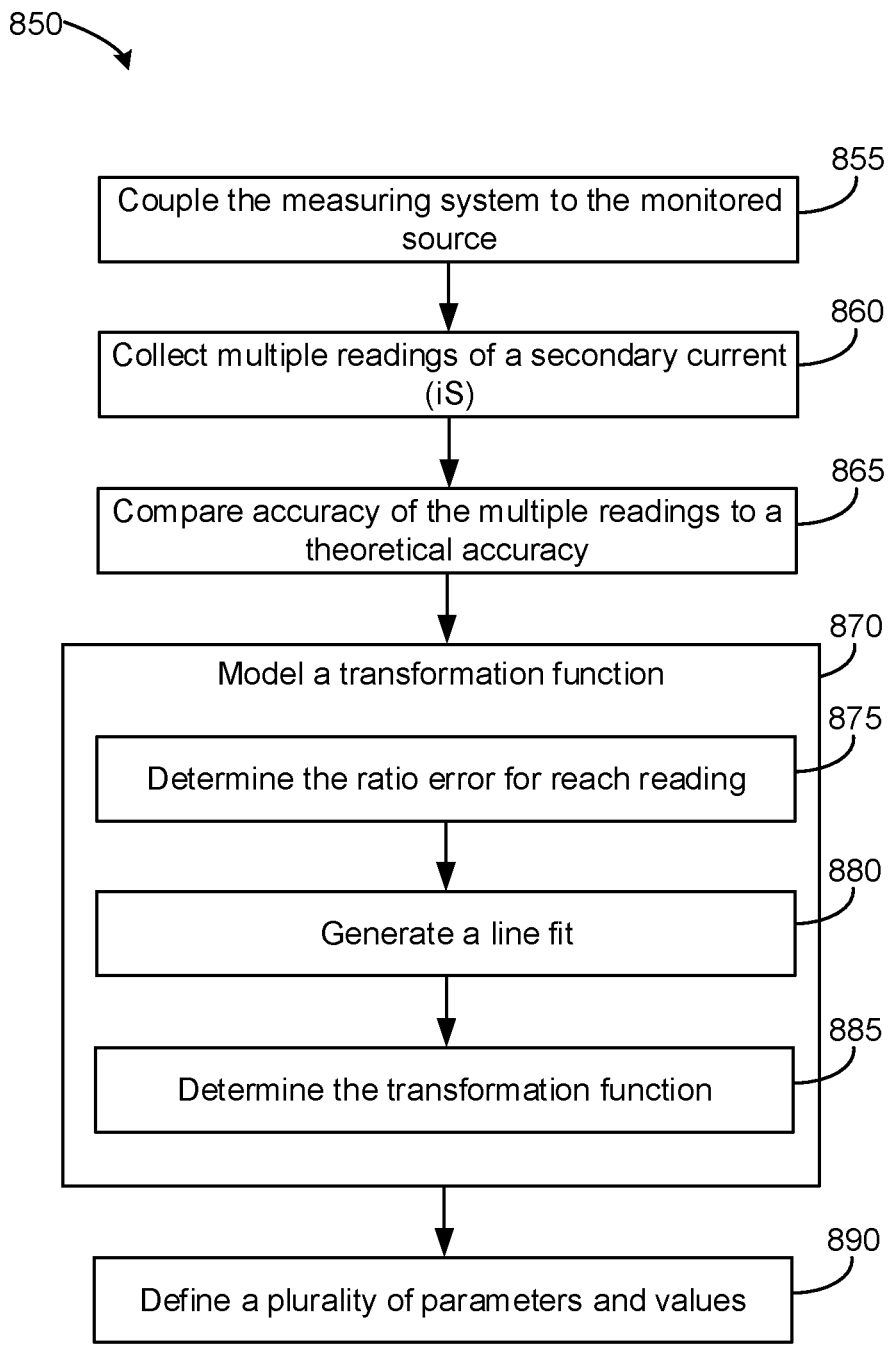
FIG. 8B is a flowchart of a method for determination of a transformation function, according to some implementations.

FIG. 8B is a flowchart of a method 850 for the determination/generation of the transformation functions. A EUM system (e.g., the EUM system 110 of FIGS. 1A-1B) can be configured to perform the method 850. Further, any computing device described herein can be configured to perform method 850.

In some implementations, method 850 can be performed by the EUM system prior to performing the steps of method 800. In various implementations, method 850 can be performed in parallel or during the performance of method 800. In broad overview of method 850, at block 855, the EUM system (e.g., the measuring system) can be coupled to the monitored source. At block 860, the EUM system can collect multiple readings of a secondary current (iS). At block 865, the EUM system can compare accuracy of the multiple readings to a theoretical accuracy. At block 870, the EUM system can model a transformation function. In some implementations, modeling the transformation function can include the EUM system performing blocks 875, 880, and 885. At block 875, the EUM system can determine the ratio error for each reading. At block 880, the EUM system can generate a line fit. At block 885, the EUM system can determine the transformation function. At block 890, the EUM system can define a plurality of parameters and values, prior to performing the steps of method 800. Additional, fewer, or different operations may be performed depending on the particular implementation. In some embodiments, some, or all operations of method 850 may be performed by EUM system executing on one or more computing devices, systems, or servers. In various embodiments, each operation may be re-ordered, added, removed, or repeated.

At block 855, the EUM system can couple the measuring system to the monitored source, the monitored source having a primary current (iP). The measuring system can be a CT that employs a nanolayered silicon carbide core to achieve attributes that enable predictable error correction. The nanolayered silicon carbide core is thermally stable to sink heat quickly away from the secondary coils of the CT. In some implementations, the EUM system can magnetically couple the measuring system around an AC energy source (or monitored electrical circuit or wire) with fluctuating changes of current that results in a range spectrum of Amps that can be read accurately from a low bottom (10 milli-Amps) of a monitored range to a top of a high monitored range (e.g., 400 Amps, which is a 400%+ improvement over Ferrite-core cast materials).

At block 860, the EUM system collect multiple readings of a secondary current (iS) induced in the measuring system by the iP. In some implementations, the EUM system can collect or obtain readings of a secondary current (or secondary magnetic field) induced in windings of the measuring system. For example, the secondary current can be induced by a monitored current in the monitored energy source.

At block 865, the EUM system compares accuracy of the multiple readings of the iS to a theoretical accuracy represented as iS=iP/n (Formula 2), wherein n is a number of coil windings around a primary loop of the measuring system. In various implementations, the EUM system can compare accuracy of the secondary readings with theoretical mathematical functions (Formula 2). The difference from the true primary current and the derived primary current can be an increase of the ratio or diminishment of the ratio. For example, a negative ratio error could appear to be 1:2600, where the windings have so much resistance that they act like a longer set of windings than they actually are. The difference in the derived ratio versus the theoretical formula ratio can be referred to herein as "the ratio error." Furthermore, the ratio error can be indicative of a departure of the value of the reading from the calculated theoretical correct values.

At block 870, the EUM system may model a transformation function of a ratio error for each reading of the multiple readings. In some implementations, modeling the transformation function can include performing, by EUM system, block 875-885. In general, when saturation of the measuring system 128 is starting to occur (e.g., above 200 Amps), the current modeler 122 can perform a transformation (sometimes referred to herein as a "distortion") by modeling the transformation function. In some implementations, prior to determining a transformation function, the current modeler 122 can generate several zones of predictable and repeatable data that can be line fit with a high degree of representation resolution. I high degree of representation resolution is manifest when a line fit is representative of the data set, such as when a perpendicular distance of an error ratio plot point from a line fit axis is within a desired error band.

At block 875, the EUM system can determine the ratio error for each reading of the multiple readings based on calculating a difference in a derived ratio versus a theoretical ratio. In some implementations, block 865 can determine the ratio error and in block 875 the EUM system can identify a reading-limit where each reading or data point outside an acceptable ratio error can be determined. For example, each reading in plotted ratio area 702 can be determined to be outside an acceptable ratio error.

At block 880, the EUM system can generate a line fit of a plotted ratio error of the ratio error for each reading of the multiple readings, wherein the line fit is generated on a baseline. In some implementations, modeling the transformation function can include generating a line fit. In particular, modeling the transformation function can include performing a line fit on a baseline (e.g., zero x-axis line) of a plotted ratio error of the ratio error for each reading of the one or more readings. That is, the current modeler 122 can contrast the line fit to a predictable/repeatable zone of data and its line fit derivation along the plotted ratio errors (e.g., plotted ratio error above the acceptable ratio error) to identify the slope-difference of the plotted ratio error of the EUM system. For example, the line fit can be generated based on constructing a straight line that has the best fit to a series of data points, such as PartC data points of FIG. 7A.

At block 885, the EUM system can determine the transformation function based on rotating or transposing the line fit of the plotted ratio error to a new reference that aligns to the baseline. In some implementation, the current modeler 122 can determine the transformation function based on rotating or transposing the line fit of the plotted ratio error to a new reference that aligns to the baseline. In particular, the transformation function can rotate or transpose a centerline-fit of the plotted ratio errors above the acceptable ratio errors to a new reference frame that aligns to the zero-error-baseline (e.g., the line-fit of the plotted ratio error now aligns with the zero-error-line axis so as to be in the same frame of reference as the plotted ratio errors). Furthermore, modeling the transformation function can include adjusting the accuracy of plotted ratio errors (e.g., plotted ratio errors are transformed from plotted ratio area 702 to plotted ratio area 704 of FIG. 7A). In some implementations, a matrix can be generated at block 885 of the plotted ratio errors above the acceptable ratio error (e.g., in plotted ratio area 702 of FIG. 7A) that can be used by the current modeler 122 to establish an orientation. In some implementations, the matrix can be rotated such that the plotted ratio errors can adjust based on the rotation without skewing the data points. Stated otherwise, in some implementations, the matrix can be rotated such that the plotted ratio errors are adjusted based on the rotation in a manner to maintain perpendicular distance (from the line fit before transformation and from the zero-error-baseline after transformation) of the plotted ratio error points. The rotation can include determining (e.g., by the current modeler 122) a reference (or base) rotation based on generating a line fit (in block 880) of the plotted ratio error to determine an orientation to the y-axis (exactly vertical) and in turn, determine a degree offset of the matrix based on the orientation to the y-axis. In some implementations, the rotated plotted ratio errors can also be squeezed or compressed such that the points are also transposed towards 0 Amps without the plotted ratio error points deviating in a perpendicular manner.

At block 890, the EUM system can define a plurality of parameters and values. In various implementations, prior to transforming the reading to a corrected reading based on executing a transformation model (block 830) the EUM system can define potential values of iP into three current areas or ranges. For example, a first current area can be currents between 0-199.99 Amps, a second current area can be currents between 200-249.99 Amps (or 220-249.99 Amps), and a third current area can be currents between 250-400 Amps (or 250-400+ Amps). In some implementations, the EUM system can define a slope parameter, a line intercept parameter, ratio error intercept parameter. The slope parameter and line intercept parameter can be used by the EUM system to assist with the transformation. The ratio error intercept parameter can be used by the EUM system to assist with the transformation in the designated current areas.

Figure 9:
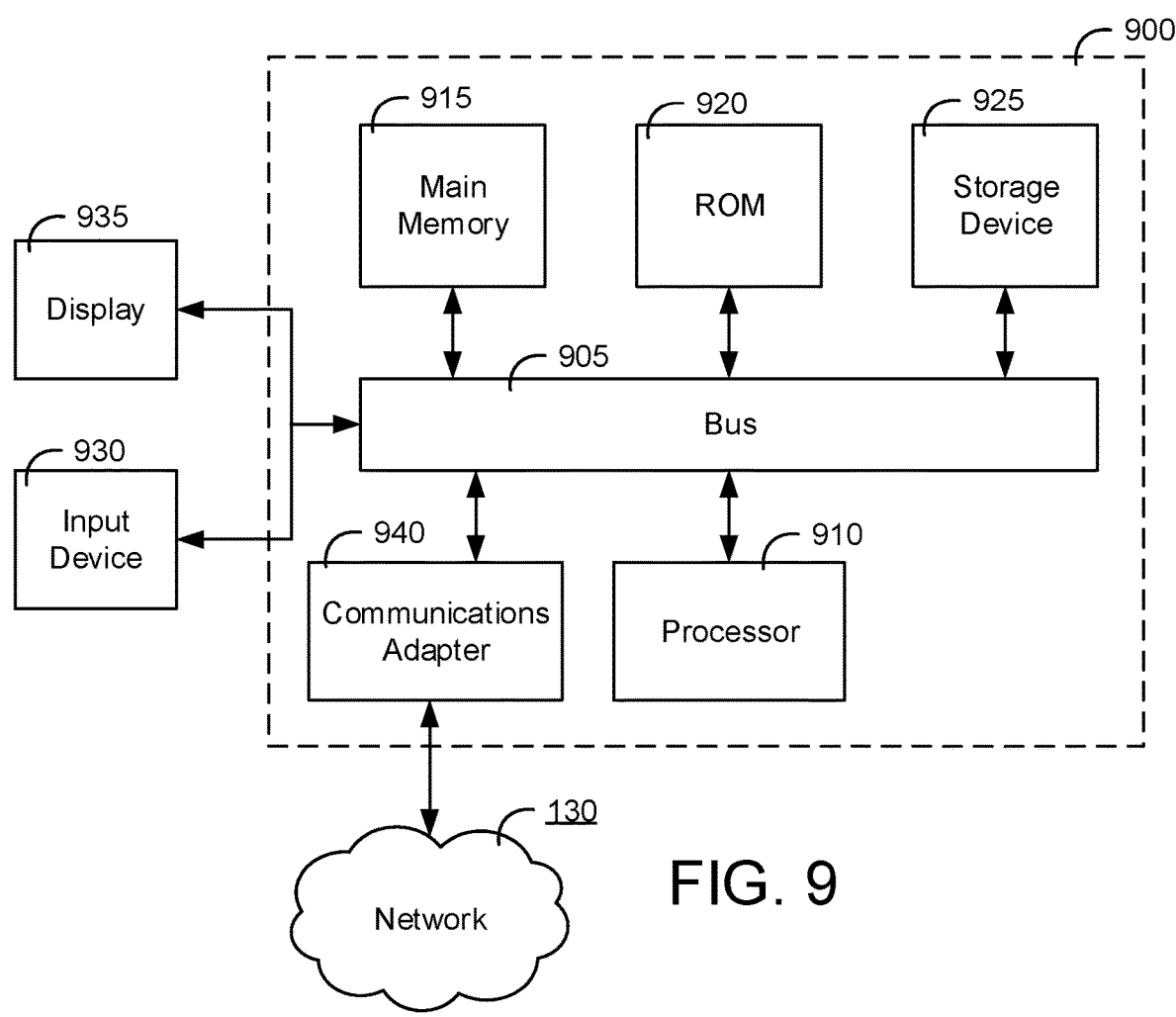
FIG. 9 is a block diagram illustrating an example computing system suitable for use in the various implementations described herein.

Referring now to FIG. 9, a depiction of a computer system 900 is shown. The computer system 900 can be used, for example, to implement a EUM system 110, user devices 140, monitoring system 150, and/or various other example systems described in the present disclosure. The computing system 900 includes a bus 905 or other communication component for communicating information and a processor 910 coupled to the bus 905 for processing information. The computing system 900 also includes main memory 915, such as a random-access memory (RAM) or other dynamic storage device, coupled to the bus 905 for storing information, and instructions to be executed by the processor 910. Main memory 915 can also be used for storing position information, temporary variables, or other intermediate information during execution of instructions by the processor 910. The computing system 900 may further include a read only memory (ROM) 920 or other static storage device coupled to the bus 905 for storing static information and instructions for the processor 910. A storage device 925, such as a solid-state device, magnetic disk, or optical disk, is coupled to the bus 905 for persistently storing information and instructions.

The computing system 900 may be coupled via the bus 905 to a display 935, such as a liquid crystal display, or active matrix display, for displaying information to a user. An input device 930, such as a keyboard including alphanumeric and other keys, may be coupled to the bus 905 for communicating information, and command selections to the processor 910. In another implementation, the input device 930 has a touch screen display 935. The input device 930 can include any type of biometric sensor, a cursor control, such as a mouse, a trackball, or cursor direction keys, for communicating direction information and command selections to the processor 910 and for controlling cursor movement on the display 935.

In some implementations, the computing system 900 may include a communications adapter 940, such as a networking adapter. In various illustrative implementations, any type of networking configuration may be achieved using communications adapter 940, such as wired (e.g., via Ethernet), wireless (e.g., via Wi-Fi, Bluetooth), satellite (e.g., via GPS) pre-configured, ad-hoc, LAN, WAN.

According to various implementations, the processes that effectuate illustrative implementations that are described herein can be achieved by the computing system 900 in response to the processor 910 executing an implementation of instructions contained in main memory 915. Such instructions can be read into main memory 915 from another computer-readable medium, such as the storage device 925. Execution of the implementation of instructions contained in main memory 915 causes the computing system 900 to perform the illustrative processes described herein. One or more processors in a multi-processing implementation may also be employed to execute the instructions contained in main memory 915. In alternative implementations, hard-wired circuitry may be used in place of or in combination with software instructions to implement illustrative implementations. Thus, implementations are not limited to any specific combination of hardware circuitry and software.

That is, although an example processing system has been described in FIG. 9, implementations of the subject matter and the functional operations described in this specification can be carried out using other types of digital electronic circuitry, or in computer software embodied on a tangible medium, firmware, or hardware, including the structures disclosed in this specification and their structural equivalents, or in combinations of one or more of them. Implementations of the subject matter described in this specification can be implemented as one or more computer programs, e.g., one or more subsystems of computer program instructions, encoded on one or more computer storage medium for execution by, or to control the operation of, data processing apparatus. Alternatively, or in addition, the program instructions can be encoded on an artificially generated propagated signal, e.g., a machine generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate components or media (e.g., multiple CDs, disks, or other storage devices). Accordingly, the computer storage medium is both tangible and non-transitory.

Although shown in the implementations of FIG. 9 as singular, stand-alone devices, one of ordinary skill in the art will appreciate that, in some implementations, the computing system 900 may comprise virtualized systems and/or system resources. For example, in some implementations, the computing system 900 may be a virtual switch, virtual router, virtual host, or virtual server. In various implementations, computing system 900 may share physical storage, hardware, and other resources with other virtual machines. In some implementations, virtual resources of the network 130 (e.g., network 130 of FIG. 1) may include cloud computing resources such that a virtual resource may rely on distributed processing across more than one physical processor, distributed memory, etc.

EXAMPLES

Some examples of embodiments of electricity usage monitoring are provided below.

Example 1. An electricity usage metering (EUM) system comprising: a coupling system to couple the EUM system to a monitored source; a measuring system to obtain a reading of a monitored current in the monitored source, the measuring system comprising an advanced nano-layered material that operates at low temperatures disproportionate to saturation levels, and the measuring system having a top-end limit beyond which physical limitations of the measuring system cause the reading to comprise an error outside an acceptable ratio error; a processing circuit to obtain the reading of the monitored current and, if the reading is beyond the top-end limit of the measuring system, to employ a transformation to correct the reading to be within the acceptable ratio error; and a communication interface configured to receive the reading from the processing circuit and to provide the reading into a communication network for communication to a destination.

Example 2. The EUM system of Example 1, wherein the monitored current is a primary current (iP) that is within the monitored source and the measuring system obtains a reading of the monitored current by measuring a secondary current (iS) induced in the measuring system by the monitored current, and wherein the measuring system and the monitored source are magnetically coupled by the coupling system.

Example 3. The EUM system of Example 1, wherein the transformation is employed to correct the reading based on utilizing a transformation model, wherein the transformation model utilized by the processing circuit is determined by: coupling the measuring system to the monitored source, the monitored source having a primary current (iP); collecting multiple measurements of a secondary current (iS) induced in the measuring system by the iP; comparing accuracy of the multiple measurements of the iS to a theoretical accuracy represented as iS=iP/n, wherein n is a number of coil windings around a primary loop of the measuring system; and modeling a transformation function of a ratio error for each measurement of the multiple measurements.

Example 4. The EUM system of Example 3, wherein modeling the transformation function of the ratio error comprises: determining the ratio error for each measurement of the multiple measurements based on calculating a difference in a derived ratio versus a theoretical ratio; generating a line fit of a plotted ratio error of the ratio error for each measurement of the multiple measurements, wherein the line fit is generated on a baseline; and determining the transformation function based on rotating or transposing the line fit of the plotted ratio error to a new reference that aligns to the baseline.

Example 5. The EUM system of Example 3, wherein the top-end limit is 220 Amps, and wherein the collected multiple measurements of the iS is between an Ampere (Amp) range of 7 microamps to 400 milliamps.

Example 6. The EUM of Example 3, wherein the top-end limit is 220 Amps, and wherein the iP is between an Ampere (Amp) range of 10 milliamps to 400 Amps during collecting the multiple measurements of the iS.

Example 7. The EUM system of Example 1, wherein the measuring system is a current transformer (CT) in which a fluctuating secondary magnetic field is induced from a fluctuating monitored magnetic field in the monitored source (i.e., the primary source), and wherein the reading of the monitored current is obtained based on the fluctuating secondary magnetic field.

Example 8. The EUM system of Example 7, wherein the measuring system comprising the advanced nano-layered material produces an error plot that comprises a linear pattern of a declination as a function of the monitored current by design that is predictable and repeatable in each manufactured CT as reflected by a tight linear banding of the empirical data.

Example 9. The EUM system of Example 7, wherein the 'correction' transformation is based on a transformation model comprising a function of the fluctuating secondary magnetic field and an inverse relationship of a monitored current ratio, and wherein the transformation extends an upper bound of readings of the monitored current beyond the standard top-end limit while maintaining operating temperatures of the measuring system within industry-defined safety threshold(s).

Example 10. The EUM system of Example 9, wherein the inverse relationship of the monitored current ratio is inversely proportional to a number of coil windings around a primary loop, wherein the primary loop is completely around the monitored source, and wherein the physical limitations of the measuring system comprise saturation in the coil windings of the measuring system.

Example 11. The EUM system of Example 1, wherein the coupling system is configured to permit coupling to and decoupling from the monitored source without modification of the monitored source affecting operation of the monitored source and without affecting operation of any electrical component of the monitored source.

Example 12. A computer-implemented method for monitoring electricity usage of a monitored source, the computer-implemented method comprising: obtaining, by an electricity usage metering (EUM) system magnetically coupled to the monitored source, a reading of a secondary current (iS) induced in the EUM system by a primary current (iP) of the monitored source, the EUM system comprising an advanced nano-layered material that operates at low temperatures disproportionate to saturation levels, and the EUM system having a top-end limit beyond which physical limitations of the EUM system cause the reading to comprise an error outside an acceptable ratio error; determining, by the EUM system, the reading is beyond the top-end limit of the EUM system; transforming, by the EUM system, the reading to a corrected reading based on utilizing a transformation model to correct the reading to be within the acceptable ratio error; and providing, by the EUM system, the corrected reading into a communication network.

Example 13. The computer-implemented method of Example 12, wherein the transformation model is determined by: collecting, by the EUM system, multiple readings of the primary current (iP); comparing, by the EUM system, accuracy of the multiple readings to a theoretical accuracy; and modeling, by the EUM system, a transformation function of a ratio error for each reading of the multiple readings.

Example 14. The computer-implemented method of Example 13, wherein modeling the transformation function of the ratio error comprises: determining, by the EUM system, the ratio error for each reading of the multiple readings based on calculating a difference in a derived ratio versus a theoretical and/or designed ratio; generating, by the EUM system, a line fit of a plotted ratio error of the ratio error for each reading of the multiple readings, wherein the line fit is contrasted to a zero-error baseline; and determining, by the EUM system, the transformation function based on rotating or transposing (e.g., a relative relation) of the line fit of the plotted ratio error to a new reference that aligns to the zero baseline.

Example 15. The computer-implemented method of Example 13, wherein the collected multiple readings of the iP are between an 10 milliAmpere (Amp) to 400 Amps range.

Example 16. The computer-implemented method of Example 12, wherein the EUM system comprises a current transformer (CT) in which a fluctuating secondary magnetic field is induced from a fluctuating monitored magnetic field in the monitored source and from which the reading of the fluctuating monitored magnetic field is obtained based on the fluctuating secondary magnetic field.

Example 17. The computer-implemented method of Example 16, wherein the advanced nano-layered material produces an error plot that comprises a linear pattern of a declination as a function of the monitored current by design that is predictable and repeatable in each manufactured CT as reflected by a tight linear banding of the empirical data.

Example 18. The computer-implemented method of Example 16, wherein the transformation is based on the transformation model comprising a function of the fluctuating secondary magnetic field and an inverse relationship of an iS current ratio, and wherein the transformation extends an upper bound of readings of the iP standard top-end limits while maintaining operating temperatures of the measuring system within industry-defined safety thresholds.

Example 19. The computer-implemented method of Example 18, wherein the inverse relationship of the iS current ratio is inversely proportional to a number of coil windings around a primary loop, and wherein the primary loop is completely around the monitored source, and wherein the physical limitations of the EUM system comprise saturation in the coil windings of the EUM system.

Example 20. The computer-implemented method of Example 12, wherein the EUM system is configured to permit coupling to and decoupling from the monitored source without modification of the monitored source affecting operation of the monitored source and without affecting operation of any electrical component of the monitored source.

Example 21. An electricity usage metering (EUM) system comprising: a coupling system to couple the EUM system to a monitored source; a current transformer (CT) in which a fluctuating secondary magnetic field is induced from a fluctuating monitored magnetic field in the monitored source and from which the reading of the fluctuating monitored magnetic field is obtained based on the fluctuating secondary magnetic field, the CT comprising an advanced nano-layered material that operates at low temperatures disproportionate to saturation levels, and the CT having a top-end limit beyond which physical limitations of the CT cause the reading to comprise an error outside an acceptable ratio error; and a processing circuit to obtain the reading of the fluctuating monitored magnetic field in the monitored source and, if the reading is beyond the top-end limit of the CT, to employ a transformation to correct the reading to be within the acceptable ratio error.

While this specification contains many specific implementation details, these should not be construed as limitations on the scope of any inventions or of what may be claimed, but rather as descriptions of features specific to particular implementations of the systems and methods described herein. Certain features that are described in this specification in the context of separate implementations can also be implemented and/or arranged in combination in a single implementation. Conversely, various features that are described in the context of a single implementation can also be implemented and arranged in multiple implementations separately or in any suitable sub combination. Moreover, although features may be described above as acting in certain combinations and even initially claimed as such, one or more features from a claimed combination can in some cases be excised from the combination, and the claimed combination may be directed to a subcombination or variation of a subcombination.

Additionally, features described with respect to particular headings may be utilized with respect to and/or in combination with illustrative implementations described under other headings; headings, where provided, are included solely for the purpose of readability, and should not be construed as limiting any features provided with respect to such headings.

Similarly, while operations are depicted in the drawings in a particular order, this should not be understood as requiring that such operations be performed in the particular order shown or in sequential order, or that all illustrated operations be performed, to achieve desirable results. In some cases, the actions recited in the claims can be performed in a different order and still achieve desirable results. In addition, the processes depicted in the accompanying figures do not necessarily require the particular order shown, or sequential order, to achieve desirable results.

In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Having now described some illustrative implementations, implementations, illustrative embodiments, and embodiments, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements, and features discussed only in connection with one implementation are not intended to be excluded from a similar role in other implementations.

The phraseology and terminology used herein is for the purpose of description and should not be regarded as limiting. The use of "including," "comprising," "having," "containing," "involving," "characterized by," "characterized in that," and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations, arrangements, elements, or acts of the systems and methods herein referred to in the singular may also embrace implementations including a plurality of these elements, and any references in plural to any implementation, arrangement, element, or act herein may also embrace implementations including only a single element. References in the singular or plural form are not intended to limit the presently disclosed systems or methods, or their components, acts, or elements to single or plural configurations. References to any act or element being based on any information, act, or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description, or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

It should be understood that no claim element herein is to be construed under the provisions of 35 U.S.C. § 112(f) unless the element is expressly recited using the phrase "means for."

As used herein, the term "circuit" may include hardware structured to execute the functions described herein. In some embodiments, each respective "circuit" may include machine-readable media for configuring the hardware to execute the functions described herein. The circuit may be embodied as one or more circuitry components, including, but not limited to, processing circuitry, network interfaces, peripheral devices, input devices, output devices, and sensors. In some embodiments, a circuit may take the form of one or more analog circuits, electronic circuits (e.g., integrated circuits (IC), discrete circuits, system on a chip (SOC) circuits), telecommunication circuits, hybrid circuits, and any other type of "circuit." In this regard, the "circuit" may include any type of component for accomplishing or facilitating achievement of the operations described herein. For example, a circuit as described herein may include one or more transistors, logic gates (e.g., NAND, AND, NOR, OR, XOR, NOT, XNOR), resistors, multiplexers, registers, capacitors, inductors, diodes, wiring.

The "circuit" may also include one or more processors communicatively coupled to one or more memory or memory devices. In this regard, the one or more processors may execute instructions stored in the memory or may execute instructions otherwise accessible to the one or more processors. In some embodiments, the one or more processors may be embodied in various ways. The one or more processors may be constructed in a manner sufficient to perform at least the operations described herein. In some embodiments, the one or more processors may be shared by multiple circuits (e.g., circuit A and circuit B may comprise or otherwise share the same processor which, in some example embodiments, may execute instructions stored, or otherwise accessed, via different areas of memory). Alternatively, or additionally, the one or more processors may be structured to perform or otherwise execute certain operations independent of one or more co-processors. In other example embodiments, two or more processors may be coupled via a bus to enable independent, parallel, pipelined, or multi-threaded instruction execution. Each processor may be implemented as one or more general-purpose processors, application specific integrated circuits (ASICs), field programmable gate arrays (FPGAs), digital signal processors (DSPs), or other suitable electronic data processing components structured to execute instructions provided by memory. The one or more processors may take the form of a single core processor, multi-core processor (e.g., a dual core processor, triple core processor, quad core processor), microprocessor. In some embodiments, the one or more processors may be external to the apparatus, for example the one or more processors may be a remote processor (e.g., a cloud based processor). Alternatively, or additionally, the one or more processors may be internal and/or local to the apparatus. In this regard, a given circuit or components thereof may be disposed locally (e.g., as part of a local server, a local computing system) or remotely (e.g., as part of a remote server such as a cloud based server). To that end, a "circuit" as described herein may include components that are distributed across one or more locations.

An exemplary system for implementing the overall system or portions of the embodiments might include a general purpose computing devices in the form of computers, including a processing unit, a system memory, and a system bus that couples various system components including the system memory to the processing unit. Each memory device may include non-transient volatile storage media, non-volatile storage media, non-transitory storage media (e.g., one or more volatile and/or non-volatile memories), etc. In some embodiments, the non-volatile media may take the form of ROM, flash memory (e.g., flash memory such as NAND, 3D NAND, NOR, 3D NOR), EEPROM, MRAM, magnetic storage, hard discs, optical discs, etc. In other embodiments, the volatile storage media may take the form of RAM, TRAM, ZRAM, etc. Combinations of the above are also included within the scope of machine-readable media. In this regard, machine-executable instructions comprise, for example, instructions and data which cause a general purpose computer, special purpose computer, or special purpose processing machines to perform a certain function or group of functions. Each respective memory device may be operable to maintain or otherwise store information relating to the operations performed by one or more associated circuits, including processor instructions and related data (e.g., database components, object code components, script components), in accordance with the example embodiments described herein.

It should also be noted that the term "input devices," as described herein, may include any type of input device including, but not limited to, a keyboard, a keypad, a mouse, joystick or other input devices performing a similar function. Comparatively, the term "output device," as described herein, may include any type of output device including, but not limited to, a computer monitor, printer, facsimile machine, or other output devices performing a similar function.

It should be noted that although the diagrams herein may show a specific order and composition of method steps, it is understood that the order of these steps may differ from what is depicted. For example, two or more steps may be performed concurrently or with partial concurrence. Also, some method steps that are performed as discrete steps may be combined, steps being performed as a combined step may be separated into discrete steps, the sequence of certain processes may be reversed or otherwise varied, and the nature or number of discrete processes may be altered or varied. The order or sequence of any element or apparatus may be varied or substituted according to alternative embodiments. Accordingly, all such modifications are intended to be included within the scope of the present disclosure as defined in the appended claims. Such variations will depend on the machine-readable media and hardware systems chosen and on designer choice. It is understood that all such variations are within the scope of the disclosure. Likewise, software and web implementations of the present disclosure could be accomplished with standard programming techniques with rule-based logic and other logic to accomplish the various database searching steps, correlation steps, comparison steps, and decision steps.

What is claimed is:

1. An electricity usage metering (EUM) system comprising:
    a coupling system to couple the EUM system to a monitored source;
    a measuring system to obtain a reading of a monitored current in the monitored source, the measuring system comprising an advanced nano-layered material that operates at low temperatures disproportionate to saturation levels, and the measuring system having a top-end limit beyond which physical limitations of the measuring system cause the reading to comprise an error outside an acceptable ratio error;
    a processing circuit to obtain the reading of the monitored current and, if the reading is beyond the top-end limit of the measuring system, to employ a transformation to correct the reading to be within the acceptable ratio error; and
    a communication interface configured to receive the reading from the processing circuit and to provide the reading into a communication network for communication to a destination.

2. The EUM system of claim 1, wherein the monitored current is a primary current (iP) that is within the monitored source and the measuring system obtains a reading of the monitored current by measuring a secondary current (iS) induced in the measuring system by the monitored current, and wherein the measuring system and the monitored source are magnetically coupled by the coupling system.

3. The EUM system of claim 1, wherein the transformation is employed to correct the reading based on utilizing a transformation model, wherein the transformation model utilized by the processing circuit is determined by:
    coupling the measuring system to the monitored source, the monitored source having a primary current (iP);

collecting multiple measurements of a secondary current (iS) induced in the measuring system by the iP;

comparing accuracy of the multiple measurements of the iS to a theoretical accuracy represented as iS=iP/n, wherein n is a number of coil windings around a primary loop of the measuring system; and modeling a transformation function of a ratio error for each measurement of the multiple measurements.

4. The EUM system of claim 3, wherein modeling the transformation function of the ratio error comprises:

determining the ratio error for each measurement of the multiple measurements based on calculating a difference in a derived ratio versus a theoretical ratio;

generating a line fit of a plotted ratio error of the ratio error for each measurement of the multiple measurements, wherein the line fit is generated on a baseline; and determining the transformation function based on rotating or transposing the line fit of the plotted ratio error to a new reference that aligns to the baseline.

5. The EUM system of claim 1, wherein the measuring system is a current transformer (CT) in which a fluctuating secondary magnetic field is induced from a fluctuating monitored magnetic field in the monitored source, and wherein the reading of the monitored current is obtained based on the fluctuating secondary magnetic field.

6. The EUM system of claim 5, wherein the measuring system comprising the advanced nano-layered material produces an error plot that comprises a linear pattern of a declination as a function of the monitored current by design that is predictable and repeatable in each manufactured CT as reflected by a tight linear banding of the empirical data.

7. The EUM system of claim 5, wherein the transformation is based on a transformation model comprising a function of the fluctuating secondary magnetic field and an inverse relationship of a monitored current ratio, and wherein the transformation extends an upper bound of readings of the monitored current beyond the top-end limit while maintaining operating temperatures of the measuring system within a threshold.

8. The EUM system of claim 7, wherein the inverse relationship of the monitored current ratio is inversely proportional to a number of coil windings around a primary loop, wherein the primary loop is completely around the monitored source, and wherein the physical limitations of the measuring system comprise saturation in the coil windings of the measuring system.

9. The EUM system of claim 1, wherein the coupling system is configured to permit coupling to and decoupling from the monitored source without modification of the monitored source affecting operation of the monitored source and without affecting operation of any electrical component of the monitored source.

10. A computer-implemented method for monitoring electricity usage of a monitored source, the computer-implemented method comprising:

obtaining, by an electricity usage metering (EUM) system magnetically coupled to the monitored source, a reading of a secondary current (iS) induced in the EUM system by a primary current (iP) of the monitored source, the EUM system comprising an advanced nano-layered material that operates at low temperatures disproportionate to saturation levels, and the EUM system having a top-end limit beyond which physical limitations of the EUM system cause the reading to comprise an error outside an acceptable ratio error;

determining, by the EUM system, the reading is beyond the top-end limit of the EUM system;

transforming, by the EUM system, the reading to a corrected reading based on utilizing a transformation model to correct the reading to be within the acceptable ratio error; and providing, by the EUM system, the corrected reading into a communication network.

11. The computer-implemented method of claim 10, wherein the transformation model is determined by:

collecting, by the EUM system, multiple readings of the primary current (iP);

comparing, by the EUM system, accuracy of the multiple readings to a theoretical accuracy; and modeling, by the EUM system, a transformation function of a ratio error for each reading of the multiple readings.

12. The computer-implemented method of claim 11, wherein modeling the transformation function of the ratio error comprises:

determining, by the EUM system, the ratio error for each reading of the multiple readings based on calculating a difference in a derived ratio versus a theoretical ratio;

generating, by the EUM system, a line fit of a plotted ratio error of the ratio error for each reading of the multiple readings; and determining, by the EUM system, the transformation function based on relative relation of the line fit of the plotted ratio error to a new reference that aligns to a zero baseline.

13. The computer-implemented method of claim 11, wherein the collected multiple readings of the iP are between a range of 10 milliAmpere (Amp) to 400 Amps.

14. The computer-implemented method of claim 10, wherein the EUM system comprises a current transformer (CT) in which a fluctuating secondary magnetic field is induced from a fluctuating monitored magnetic field in the monitored source and from which the reading of the fluctuating monitored magnetic field is obtained based on the fluctuating secondary magnetic field.

15. The computer-implemented method of claim 14, wherein the advanced nano-layered material produces an error plot that comprises a linear pattern of a declination as a function of the monitored current by design that is predictable and repeatable in each manufactured CT as reflected by a tight linear banding of the empirical data.

16. The computer-implemented method of claim 14, wherein the transformation is based on the transformation model comprising a function of the fluctuating secondary magnetic field and an inverse relationship of an iS current ratio, and wherein the transformation extends an upper bound of readings of the iP standard top-end limits while maintaining operating temperatures of the measuring system within industry-defined safety thresholds.

17. The computer-implemented method of claim 16, wherein the inverse relationship of the iS current ratio is inversely proportional to a number of coil windings around a primary loop, and wherein the primary loop is completely around the monitored source, and wherein the physical limitations of the EUM system comprise saturation in the coil windings of the EUM system.

18. The computer-implemented method of claim 10, wherein the EUM system is configured to permit coupling to and decoupling from the monitored source without modification of the monitored source affecting operation of the monitored source and without affecting operation of any electrical component of the monitored source.

19. An electricity usage metering (EUM) system comprising:
- a coupling system to couple the EUM system to a monitored source;
- a current transformer (CT) in which a fluctuating secondary magnetic field is induced from a fluctuating monitored magnetic field in the monitored source and from which the reading of the fluctuating monitored magnetic field is obtained based on the fluctuating secondary magnetic field, the CT comprising an advanced nano-layered material that operates at low temperatures disproportionate to saturation levels, and the CT having a top-end limit beyond which physical limitations of the CT cause the reading to comprise an error outside an acceptable ratio error; and
- a processing circuit to obtain the reading of the fluctuating monitored magnetic field in the monitored source and, if the reading is beyond the top-end limit of the CT, to employ a transformation to correct the reading to be within the acceptable ratio error.

20. The EUM system of claim 19, wherein the transformation is employed to correct the reading based on utilizing a transformation model, wherein the transformation model utilized by the processing circuit is determined by:
- coupling the CT system to the monitored source, the monitored source having a primary current (iP);
- collecting multiple measurements of a secondary current (iS) induced in the CT by the iP;
- comparing accuracy of the multiple measurements of the iS to a theoretical accuracy represented as iS=iP/n, wherein n is a number of coil windings around a primary loop of the measuring system; and
- modeling a transformation function of a ratio error for each measurement of the multiple measurements.

* * * * *